(12) United States Patent
Mehta et al.

(10) Patent No.: US 6,611,463 B1
(45) Date of Patent: Aug. 26, 2003

(54) ZERO-POWER PROGRAMMABLE MEMORY CELL

(75) Inventors: Sunil Mehta, San Jose, CA (US); Fabiano Fontana, San Jose, CA (US)

(73) Assignee: Lattice Semiconductor Corporation, Hillsboro, OR (US)

(*) Notice: Subject to any disclaimer, the term of this patent is extended or adjusted under 35 U.S.C. 154(b) by 98 days.

(21) Appl. No.: 09/991,245

(22) Filed: Nov. 14, 2001

(51) Int. Cl.[7] ............................................. G11C 16/04

(52) U.S. Cl. ........................... 365/185.28; 365/185.24; 365/185.29

(58) Field of Search ...................... 365/185.28, 185.29, 365/185.23, 185.24, 189.09

(56) References Cited

U.S. PATENT DOCUMENTS

| | | | |
|---|---|---|---|
| 4,829,203 A | 5/1989 | Ashmore, Jr. | 307/469 |
| 4,862,019 A | 8/1989 | Ashmore, Jr. | 307/469 |
| 4,866,307 A | 9/1989 | Ashmore, Jr. | 307/469 |
| 4,885,719 A | 12/1989 | Brahmbhatt | 365/181 |
| 4,924,278 A | 5/1990 | Logie | 357/23.5 |
| 5,270,587 A | 12/1993 | Zagar | 307/469 |
| 5,970,012 A * | 10/1999 | Takeshima | 365/230.01 |
| 6,028,789 A | 2/2000 | Mehta et al. | 365/185.14 |
| 6,385,107 B1 * | 5/2002 | Bedarida et al. | 365/206 |
| 6,489,806 B1 * | 12/2002 | Mehta et al. | 326/46 |

OTHER PUBLICATIONS

Patent application Ser. No. 09/704,487 filed Nov. 2, 2000, with title "Wide Input Programmable Logic System and Method" to Ravindar M. Lall, now US Patent No. 6,507, 212.

* cited by examiner

Primary Examiner—Vu A. Le
Assistant Examiner—Hien Nguyen
(74) Attorney, Agent, or Firm—Monica H. Choi

(57) ABSTRACT

A zero-power electrically erasable and programmable memory cell is implemented in CMOS (complementary metal oxide semiconductor) technology. A P-channel sense transistor has a source coupled to a first voltage generator, and an N-channel sense transistor has a source coupled to a second voltage generator. The drains of the P-channel and N-channel sense transistors are coupled together to form an output of the memory cell, and the gates of the P-channel and N-channel sense transistor are coupled together to form a floating gate of the memory cell. In an example embodiment of the present invention, each of the first and second voltage generators are variable voltage generators that apply a positive voltage at the respective source of each of the P-channel and N-channel sense transistors during the erase operation and/or that apply a ground or negative voltage at the respective source of each of the P-channel and N-channel sense transistors during the program operation. In another embodiment of the present invention, a magnitude of the respective threshold voltage of each of the P-channel and N-channel sense transistors is higher than a magnitude of a threshold voltage of standard process P-channel and N-channel transistors. With such a higher threshold voltage, the P-channel and N-channel sense transistors do not erroneously turn on to dissipate power during the read operation, to ensure that the memory cell is a zero-power memory cell.

31 Claims, 12 Drawing Sheets

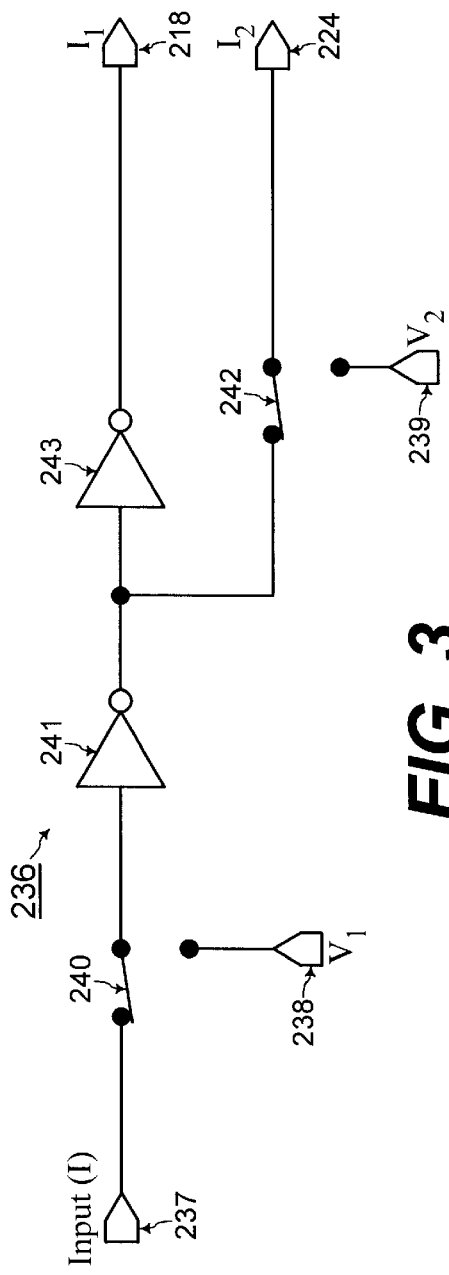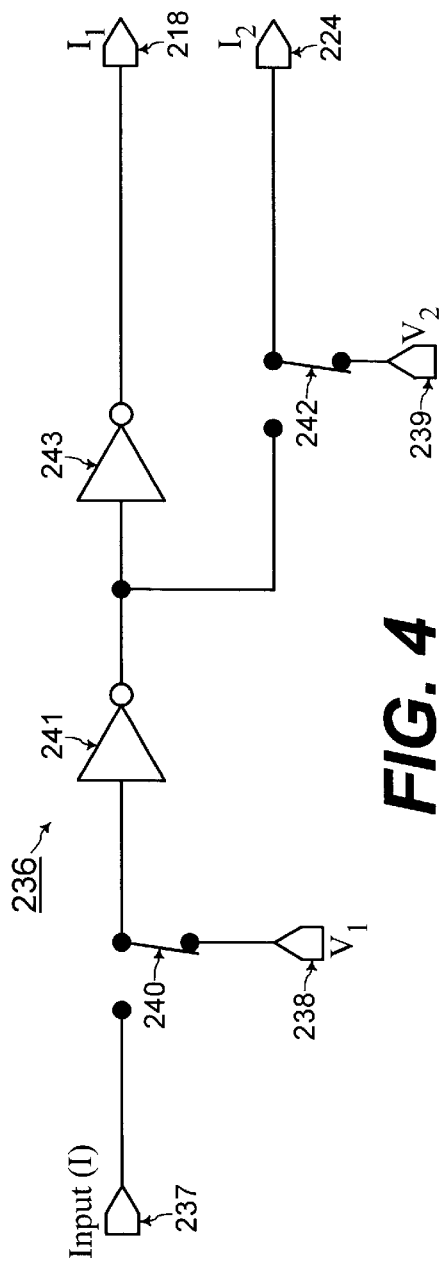

| $I_1$ | $I_2$ | $M_{OUT1}$ | $M_{OUT2}$ | Output |
|---|---|---|---|---|
| 0 | 0 | 0 | 0 | 1 |
| 0 | 0 | 0 | 1 | 1 |
| 0 | 0 | 1 | 0 | 1 |
| 0 | 0 | 1 | 1 | 0 |
| 0 | 1 | 0 | 0 | 1 |
| 0 | 1 | 0 | 1 | 1 |
| 0 | 1 | 1 | 0 | 0 |
| 0 | 1 | 1 | 1 | 0 |
| 1 | 0 | 0 | 0 | 1 |
| 1 | 0 | 0 | 1 | 0 |
| 1 | 0 | 1 | 0 | 1 |
| 1 | 0 | 1 | 1 | 0 |
| 1 | 1 | 0 | 0 | 0 |
| 1 | 1 | 0 | 1 | 0 |
| 1 | 1 | 1 | 0 | 0 |
| 1 | 1 | 1 | 1 | 0 |

*FIG. 5*

| $I_1$ | $I_2$ | $M_{OUT1}$ | $M_{OUT2}$ | Output |
|---|---|---|---|---|
| 0 | 0 | 0 | 0 | 1 |
| 0 | 0 | 0 | 1 | 1 |
| 0 | 0 | 1 | 0 | 1 |
| 0 | 0 | 1 | 1 | 1 |
| 0 | 1 | 0 | 0 | 1 |
| 0 | 1 | 0 | 1 | 0 |
| 0 | 1 | 1 | 0 | 1 |
| 0 | 1 | 1 | 1 | 0 |
| 1 | 0 | 0 | 0 | 1 |
| 1 | 0 | 0 | 1 | 1 |
| 1 | 0 | 1 | 0 | 0 |
| 1 | 0 | 1 | 1 | 0 |
| 1 | 1 | 0 | 0 | 1 |
| 1 | 1 | 0 | 1 | 0 |
| 1 | 1 | 1 | 0 | 0 |
| 1 | 1 | 1 | 1 | 0 |

*FIG. 7*

| Operation | CG | WL | WBL | $V_D$ | $V_S$ | $M_{OUT}$ |
|---|---|---|---|---|---|---|
| Erase | $V_{pp+}$=12V | $V_{dd}$=1.8V | 0V | $V_{dd}$=1.8V | $V_{dd}$=1.8V | $V_{dd}$=1.8V |
| Program | 0V | $V_{pp+}$=12V | $V_{pp}$=11V | 0V | 0V | 0V |
| Read | 0.9V | $V_{dd}$=1.8V | 0.9V | $V_{dd}$=1.8V | 0V | $V_{dd}$ or 0V |

ZERO-POWER PROGRAMMABLE MEMORY CELL

BACKGROUND OF THE INVENTION

1. Field of the Invention

The present invention relates generally to non-volatile memory devices, and more particularly, to zero-power electrically erasable and programmable memory cells, such as EEPROM cells.

2. Discussion of the Related Art

Referring to FIG. 1, an example programmable logic device is a programmable AND gate 100 of the prior art. The programmable AND gate 100 includes a first input node 102 for inputting a first input signal, A, and a second input node 104 for inputting a second input signal, B. The first input signal, A, is coupled through a first inverter 106 and a second inverter 108 to the gate of a first NMOSFET (N-channel metal oxide semiconductor field effect transistor) 110. The complement of the first input signal, designated as A*, (i.e., the output of the first inverter 106) is coupled to the gate of a second NMOSFET (N-channel metal oxide semiconductor field effect transistor) 112.

Similarly, the second input signal, B, is coupled through a third inverter 114 and a fourth inverter 116 to the gate of a third NMOSFET (N-channel metal oxide semiconductor field effect transistor) 118. The complement of the second input signal, designated as B*, (i.e., the output of the third inverter 114) is coupled to the gate of a fourth NMOSFET (N-channel metal oxide semiconductor field effect transistor) 120.

A first programmable switch 122 is coupled between the drain of the first NMOSFET 110 and an output node 130, and a second programmable switch 124 is coupled between the drain of the second NMOSFET 112 and the output node 130. Similarly, a third programmable switch 126 is coupled between the drain of the third NMOSFET 118 and the output node 130, and a fourth programmable switch 128 is coupled between the drain of the fourth NMOSFET 120 and the output node 130. In addition, a current source 132 is coupled to the output node 130 for charging the output node 130 when the output signal at the output node 130 turns to a logical high state.

For operation of the programmable AND gate 100 of FIG. 1, the first, second, third, and fourth switches 122, 124, 126, and 128 are programmable to be switched open or closed. One of the first and second programmable switches 122 and 124 is programmed to be open, and the other is programmed to be closed. Similarly, one of the third and fourth programmable switches 126 and 128 is programmed to be open, and the other is programmed to be closed.

The output node 130 of the programmable AND gate 100 provides an AND operation (of one of the first input signal, A, or the complement of the first input signal, A*, and one of the second input signal, B, or the complement of the second input signal, B*. If the first switch 122 is programmed to be closed with the second switch 124 being programmed to be open, then the programmable AND gate 100 provides an AND operation with the complement of the first input signal, A*, instead of the first input signal, A. On the other hand, if the first switch 122 is programmed to be open with the second switch 124 being programmed to be closed, then the programmable AND gate 100 provides an AND operation with the first input signal, A, instead of the complement of the first input signal, A*.

Similarly, if the third switch 126 is programmed to be closed with the fourth switch 128 being programmed to be open, then the programmable AND gate 100 provides an AND operation with the complement of the second input signal, B*, instead of the second input signal, B. On the other hand, if the third switch 126 is programmed to be open with the fourth switch 128 being programmed to be closed, then the programmable AND gate 100 provides an AND operation with the second input signal, B, instead of the complement of the second input signal, B*.

Thus, in the example illustration of FIG. 1, since the first switch 122 is programmed to be closed while the second switch 124 is programmed to be open, the programmable AND gate 100 provides an AND operation with the complement of the first input signal, A*, instead of the first input signal, A. Also, since the third switch 126 is programmed to be open while the fourth switch 128 is programmed to be closed, the programmable AND gate 100 provides an AND operation with the second input signal, B, instead of the complement of the second input signal, B*.

Thus, the output node 130 provides an output signal= A*·B. Referring to FIG. 1, only in the case when the first input signal, A, is a logical low state and the second input signal, B, is a logical high state, all of the first, second, third, and fourth NMOSFETs 110, 112, 118, and 120 do not conduct current away from the output node 130. Thus, the current from the current source 132 charges up the output node 130 to a logical high state in that case. For any other logical states of the first and second input signals, A and B, at least one of the first NMOSFET 110 and the fourth NMOSFET 120 conducts current out of the output node 130 to couple the output node 130 to ground such that a logical low state is formed at the output node 130.

In the prior art programmable AND gate 100 of FIG. 1, a constant amount of current from the current source 132 is dissipated when at least one of the first NMOSFET 110 and the fourth NMOSFET 120 conducts current out of the output node 130 to couple the output node 130 to ground. Such constant current flow results in disadvantageous power dissipation. In addition, device dimensions are constantly scaled down with advancement of IC (integrated circuit) technology. However, as supply voltages are further scaled down along with device dimensions, the noise margin of the prior art programmable AND gate 100 of FIG. 1 disadvantageously decreases to deteriorate the performance of the AND gate 100. In addition, the steady state current of the current source 132 does not necessarily scale down with device dimensions such that the prior art programmable AND gate 100 of FIG. 1 still has disadvantageous steady state power dissipation even with scaling down of device dimensions.

Thus, a mechanism is desired for implementing programmable logic devices such as programmable AND gates and programmable OR gates with minimized static power dissipation and with further scalability of device dimensions and supply voltages.

SUMMARY

Accordingly, in a general aspect of the present invention, a zero-power electrically erasable and programmable memory cell is implemented in CMOS (complementary metal oxide semiconductor) technology. Such a zero-power electrically erasable and programmable memory cell may advantageously form part of programmable logic devices such as programmable AND, OR, NAND, or NOR gates with minimized static power dissipation.

According to a general embodiment for an electrically erasable and programmable zero-power memory cell, a P-channel sense transistor has a source coupled to a first voltage generator, and an N-channel sense transistor has a source coupled to a second voltage generator. A drain of the P-channel sense transistor is coupled to a drain of the N-channel sense transistor to form an output of the memory cell, and a gate of the P-channel sense transistor is coupled to a gate of the N-channel sense transistor to form a floating gate of the memory cell. In addition, a write transistor has a source coupled to a WBL (write bit line) and has a gate coupled to a WL (write line). A tunneling capacitor is coupled between the floating gate of the memory cell and a drain of the write transistor, and a coupling capacitor is coupled between a CG (control gate) node and the floating gate of the memory cell.

The CG (control gate) node is biased with a positive voltage during an erase operation, and the WBL (write bit line) and the WL (write line) are biased to turn on the write transistor such that a negative voltage forms on the floating gate of the memory cell by charge tunneling through the tunneling capacitor. In that case, the P-channel sense transistor turns on for forming a logical high state at the output of the memory cell during the erase operation. Alternatively, the CG (control gate) node is biased with a ground or negative voltage during a program operation, and the WBL (write bit line) and the WL (write line) are biased to turn on the write transistor such that a positive voltage forms on the floating gate of the memory cell by charge tunneling through the tunneling capacitor. In that case, the N-channel sense transistor turns on for forming a logical low state at the output of the memory cell during the program operation.

In an example embodiment of the present invention, each of the first and second voltage generators are variable voltage generators that apply a positive voltage at the respective source of each of the P-channel and N-channel sense transistors during the erase operation and/or that apply a ground or negative voltage at the respective source of each of the P-channel and N-channel sense transistors during the program operation.

In another embodiment of the present invention, a magnitude of the respective threshold voltage of each of the P-channel and N-channel sense transistors is higher than a magnitude of a threshold voltage of standard process P-channel and N-channel transistors. For example, a sum of a magnitude of a respective threshold voltage of the P-channel sense transistor and a magnitude of a respective threshold voltage of the N-channel sense transistor is greater than a minimum value in a range of a difference of a first voltage generated by the first voltage generator and a second voltage generated by the second voltage generator during a read operation of the memory cell. In that case, the thickness of the respective gate oxide for each of the P-channel and N-channel sense transistors is for a high voltage MOSFET, and the concentration of the respective channel doping for each of the P-channel and N-channel sense transistors is for a low voltage MOSFET. With such a higher threshold voltage, the P-channel and N-channel sense transistors do not erroneously turn on to dissipate power during the read operation, to ensure that the memory cell is a zero-power memory cell.

The zero-power electrically erasable and programmable memory cell is implemented in CMOS (complementary metal oxide semiconductor) technology when the P-channel sense transistor is comprised of a PMOSFET (P-channel metal oxide semiconductor field effect transistor), and when the N-channel sense transistor and the write transistor are comprised of NMOSFETs (N-channel metal oxide semiconductor field effect transistors).

In this manner, the zero-power electrically erasable and programmable memory cell of the present invention is implemented in CMOS technology without use of any current source. Rather, the electrically erasable and programmable memory cell of the present invention operates to provide logic levels with zero power dissipation. In addition, the electrically erasable and programmable memory cell implemented in CMOS technology in the present invention is further scalable.

These and other features and advantages of the present invention will be better understood by considering the following detailed description of the invention which is presented with the attached drawings.

BRIEF DESCRIPTION OF THE DRAWINGS

FIG. 3 shows a block diagram of an input signal selection circuit for switching a logic cell input signal and the complement of the logic cell input signal as first and second input signals to a zero-power logic cell during a functional mode, according to an embodiment of the present invention;

FIG. 4 shows the block diagram of the input signal selection circuit of FIG. 3 for switching a first logic state for the first input signal and a second logic state for the second input signal to a zero-power logic cell with the first input signal being independent of the second input signal during a verify mode, according to an embodiment of the present invention;

FIG. 5 shows a truth table of the output signal at the output node of the first embodiment of the zero-power logic cell of FIG. 2;

FIG. 7 shows a truth table of the output signal at the output node of the second embodiment of the zero-power logic cell of FIG. 6;

The figures referred to herein are drawn for clarity of illustration and are not necessarily drawn to scale. Elements having the same reference number in FIGS. 1, 2, 3, 4, 5, 6, 7, 8, 9, 10, 11, 12, 13, 14, 15, and 16 refer to elements having similar structure and function.

DETAILED DESCRIPTION

Figure 1:
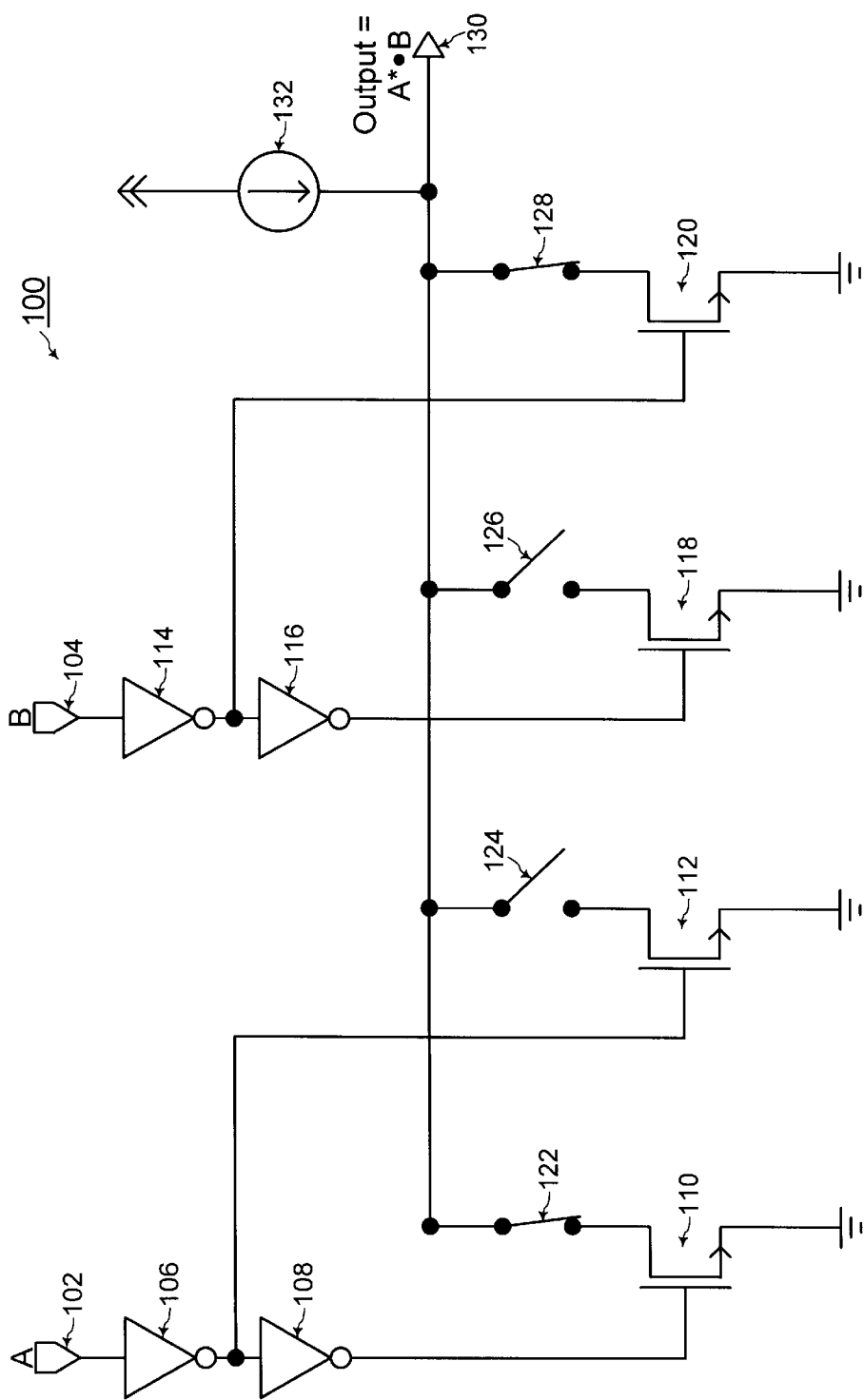
FIG. 1 shows a programmable AND gate implemented with programmable switches and a current source, according to the prior art.
Figure 2:
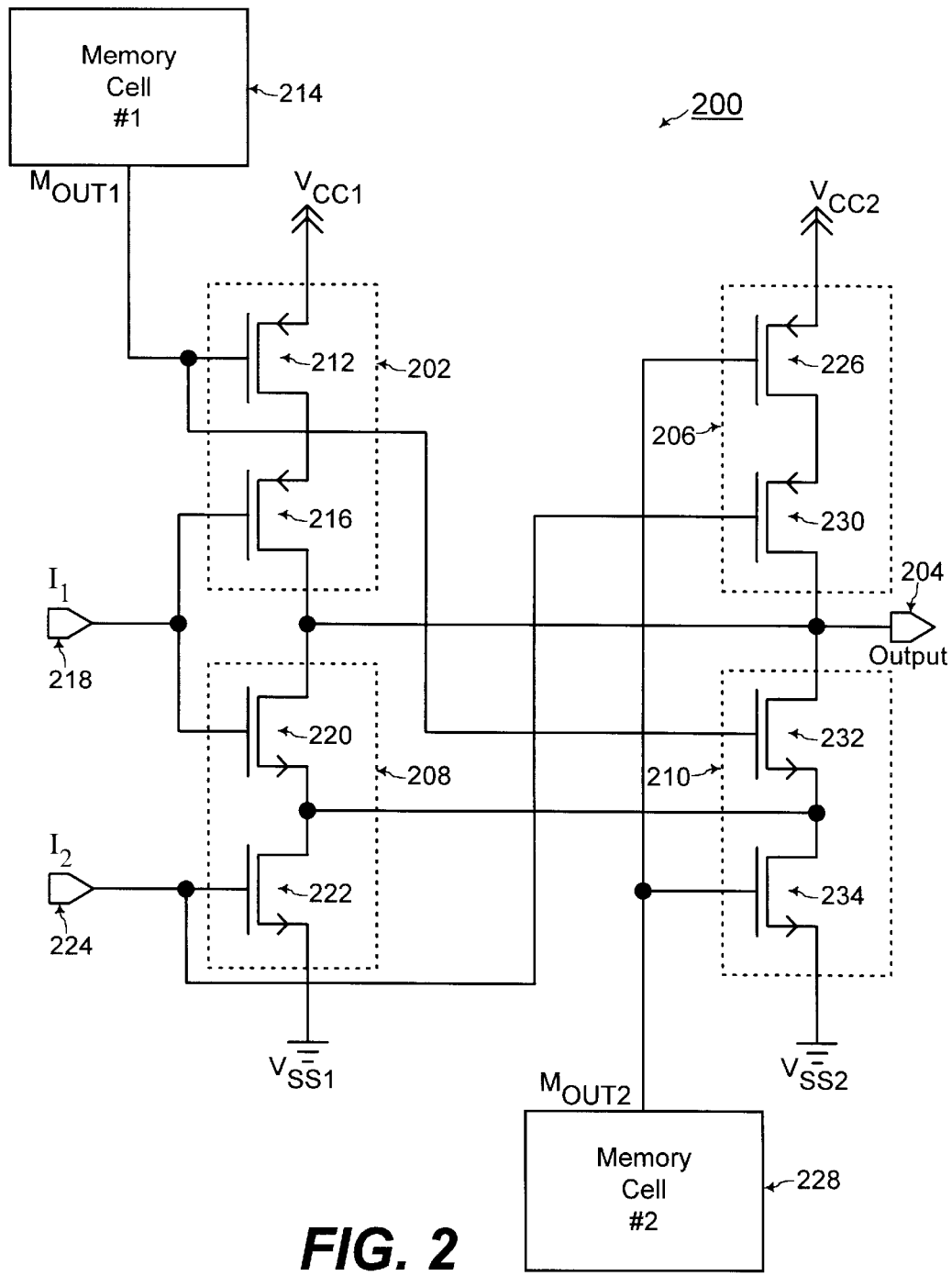
FIG. 2 shows a circuit diagram representation of a zero-power logic cell implemented in CMOS (complementary metal oxide semiconductor) technology, according to a first embodiment of the present invention.

Referring to FIG. 2, a first embodiment of a zero-power programmable logic cell 200 is implemented in CMOS (complementary metal oxide semiconductor) technology. The programmable logic cell 200 includes a first pair of stacked PMOSFETs (P-channel metal oxide semiconductor field effect transistors) 202 coupled between a first rail voltage $V_{CC1}$ and an output node 204. In addition, a second pair of stacked PMOSFETs (P-channel metal oxide semiconductor field effect transistors) 206 is coupled between a second rail voltage $V_{CC2}$ and the output node 204.

Furthermore, a first pair of stacked NMOSFETs (N-channel metal oxide semiconductor field effect transistors) 208 is coupled between a third rail voltage $V_{SS1}$ and the output node 204, and a second pair of stacked NMOSFETs (N-channel metal oxide semiconductor field effect transistors) 210 is coupled between a fourth rail voltage $V_{SS2}$ and the output node 204. In one embodiment of the present invention, the first and second rail voltages $V_{CC1}$ and $V_{CC2}$ are at the voltage level of 1.8 Volts, and the third and fourth rail voltages $V_{SS1}$ and $V_{SS2}$ are at the ground voltage level of 0 Volts.

Further referring to FIG. 2, the gate of a first PMOSFET 212 of the first pair of PMOSFETs 202 is coupled to an output $M_{OUT1}$ of a first memory cell 214. In addition, a second PMOSFET 216 of the first pair of PMOSFETs 202 has the gate coupled to a first input signal, $I_1$, at a first input node 218 and has the drain coupled to the output node 204. The first PMOSFET 212 and the second PMOSFET 216 are stacked with the drain of the first PMOSFET 212 being coupled to the source of the second PMOSFET 216.

Furthermore, a first NMOSFET 220 of the first pair of NMOSFETs 208 has the gate coupled to the first input signal, $I_1$, on the first input node 218 and has the drain coupled to the output node 204. In addition, the gate of a second NMOSFET 222 of the first pair of NMOSFETs 208 is coupled to a second input signal, $I_2$, at a second input node 224. The first NMOSFET 220 and the second NMOSFET 222 are stacked with the source of the first NMOSFET 220 being coupled to the drain of the second NMOSFET 222.

Additionally, the gate of a third PMOSFET 226 of the second pair of PMOSFETs 206 is coupled to an output $M_{OUT2}$ of a second memory cell 228. Furthermore, a fourth PMOSFET 230 of the second pair of PMOSFETs 206 has the gate coupled to the second input signal, $I_2$, at the second input node 224 and has the drain coupled to the output node 204. The third PMOSFET 226 and the fourth PMOSFET 230 are stacked with the drain of the third PMOSFET 226 being coupled to the source of the fourth PMOSFET 230.

Also, a third NMOSFET 232 of the second pair of NMOSFETs 210 has the gate coupled to the output of the first memory cell 214 and has the drain coupled to the output node 204. In addition, the gate of a fourth NMOSFET 234 of the second pair of NMOSFETs 210 is coupled to the output of the second memory cell 228. The third NMOSFET 232 and the fourth NMOSFET 234 are stacked with the source of the third NMOSFET 232 being coupled to the drain of the fourth NMOSFET 234. The drain of the second NMOSFET 222 is coupled to the drain of the fourth NMOSFET 234.

The first and second input signals, $I_1$ and $I_2$, are determined by an input signal selection circuit 236 of FIG. 3. A logic cell input signal, I, is coupled to a logic cell input signal node 237 of the input signal selection circuit 236. In addition, a first logic state, $V_1$, is coupled to a first logic state input node 238, and a second logic state, $V_2$, is coupled to a second logic state input node 239. A first switch 240 is switched between coupling the logic cell input signal, I, at the logic cell input signal node 237 or the first logic state, $V_1$, at the first logic state input node 238 to the input of a first inverter 241. A second switch 242 is switched between coupling the output of the first inverter 241 or the second logic state, $V_2$, at the second logic state input node 239 to the second input node 224 for providing the second input signal, $I_2$, of the logic cell 200. The output of the first inverter 241 is input to a second inverter 243, and the output of the second inverter 243 is coupled to the first input node 218 for providing the first input signal, $I_1$, of the logic cell 200.

During a functional mode of the logic cell 200, the first switch 240 is at the switched position for coupling the logic cell input signal, I, to the input of the first inverter 241, and the second switch 242 is at the switched position for coupling the output of the first inverter 241 to the second input node 224 of the logic cell 200, as illustrated in FIG. 3. Thus, in the functional mode of FIG. 3, the logic cell input signal, I, is formed as the first input signal, $I_1$, at the first input node 218 of the logic cell 200, and the complement of the logic cell input signal, designated as I*, is formed as the second input signal, $I_2$, at the second input node 224 of the logic cell 200.

Referring to FIG. 4, in a verify mode of the logic cell 200, the first switch 240 is at the switched position for coupling the first logic state, $V_1$, to the input of the first inverter 241, and the second switch 242 is at the switched position for coupling the second logic state, $V_2$, to the second input node 224 of the logic cell 200. In the verify mode of FIG. 4, the first logic state, $V_1$, is formed as the first input signal, $I_1$, at the first input node 218 of the logic cell 200, and the second logic state, $V_2$, is formed as the second input signal, $I_2$, at the second input node 224 of the logic cell 200.

During the verify mode, the first logic state, $V_1$, is applied at the first logic state input node 238 that is separate from the second logic state input node 239 having the second logic state, $V_2$, applied thereon. Thus, the first logic state, $V_1$, formed as the first input signal, $I_1$, at the first input node 218 of the logic cell 200 is independent from the second logic state, $V_2$, formed as the second input signal, $I_2$, at the second input node 224 of the logic cell 200, during the verify mode. In contrast, in the functional mode, the first input signal, $I_1$, at the first input node 218 and the second input signal, $I_2$, at the second input node 224 are complements of each other.

FIG. 5 shows a truth table of the output signal formed at the output node 204 of the logic cell 200 of FIG. 2 for various logic states of the first input signal, $I_1$, and the second input signal, $I_2$, and for various logic states of the first output, $M_{OUT1}$, of the first memory cell 214 and of the second output, $M_{OUT2}$, of the second memory cell 228. "1"

represents a logical high state, and "0" represents a logical low state. A first block 244 of the rows of the truth table of FIG. 5 is for the functional mode of the logic cell 200 when the first input signal, $I_1$, and the second input signal, $I_2$, are complements of each other. Referring to FIGS. 2 and 3, during such a functional mode, the first input signal, $I_1$, is the logic cell input signal I, and the second input signal, $I_2$, is the complement of the logic cell input signal, I*.

During the functional mode of the logic cell 200 of FIG. 2, the output signal at the output node 204 is determined by the logic states programmed within the first and second memory cells 214 and 228. The output of each of the first and second memory cells 214 and 228 is programmed to be one of a logical high state or a logical low state. Then, depending on such outputs $M_{OUT1}$ and $M_{OUT2}$ of the first and second memory cells 214 and 228, the output signal at the output node 204 of the logic cell 200 during the functional mode is determined according to the following truth table:

| $M_{OUT1}$ | $M_{OUT2}$ | OUTPUT |
|---|---|---|
| 0 | 0 | 1 |
| 0 | 1 | $I_1^* = I^* = I_2$ |
| 1 | 0 | $I_2^* = I = I_1$ |
| 1 | 1 | 0 |

Thus, in the functional mode, the logic cell 200 is programmed to have one of four outputs, "0", "1", "I", or "I*" by programming the logic state at the respective output of each of the first and second memory cells 214 and 228. In addition, the example embodiment of the logic cell 200 of FIG. 2 is implemented in CMOS technology with the first and second pairs of stacked PMOSFETs 202 and 206 and with the first and second pairs of stacked NMOSFETs 208 and 210. Furthermore, the logic cell 200 is a zero-power logic cell because each node of the circuit of the logic cell 200 of FIG. 2 is either charged up to a logical high state or is charged down to a logical low state without any steady-state current dissipation.

In the programmable logic cell 200, the gate of the first NMOSFET 220 is coupled to the first input signal, $I_1$, and the gate of the second NMOSFET 222 is coupled to the second input signal $I_2$. The gate of the third NMOSFET 232 is coupled to the output of the first memory cell 214, and the gate of the fourth NMOSFET 234 is coupled to the output of the second memory cell 228. Because the third and fourth NMOSFETs 232 and 234 are not in the path of the input signals, $I_1$ and $I_2$, the third and fourth NMOSFETs 232 and 234 may be sized to be smaller (i.e., with a smaller width) than the first and second NMOSFETs 220 and 222 that are in the path of the input signals, $I_1$ and $I_2$. With such a smaller size, the third and fourth NMOSFETs 232 and 234 advantageously contribute less parasitic capacitance at the output node 204.

Figure 6:
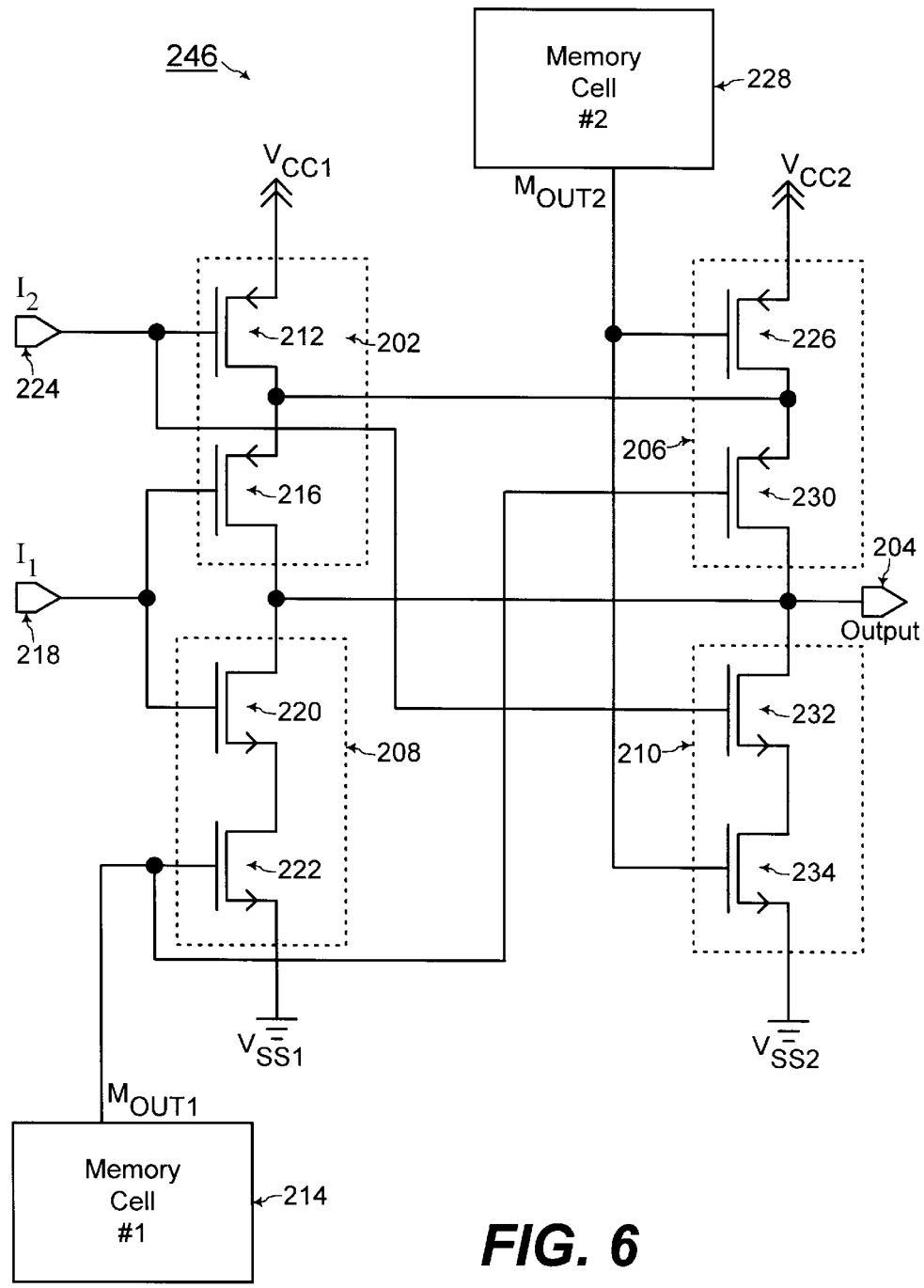
FIG. 6 shows a circuit diagram representation of a zero-power logic cell implemented in CMOS (complementary metal oxide semiconductor) technology, according to a second embodiment of the present invention.

Referring to FIG. 6, a second embodiment of a zero-power programmable logic cell 246 is implemented in CMOS (complementary metal oxide semiconductor) technology. Similar to the first embodiment of the logic cell 200 of FIG. 2, the second embodiment of the logic cell 246 of FIG. 6 includes the first pair of stacked PMOSFETs 202, the second pair of stacked PMOSFETs 206, the first pair of stacked NMOSFETs 208, and the second pair of stacked NMOSFETs 210.

However, in contrast to the first embodiment of the logic cell 200 of FIG. 2, for the second embodiment of the logic cell 246 of FIG. 6, the gate of the first PMOSFET 212 and the gate of the third NMOSFET 232 are coupled to the second input signal, $I_2$, (instead of to the first output $M_{OUT1}$ of the first memory cell 214). In addition, the gate of the second NMOSFET 222 and the gate of the fourth PMOSFET 230 are coupled to the first output $M_{OUT1}$ of the first memory cell 214 (instead of to the second input signal, $I_2$). Furthermore, the drain of the first PMOSFET 212 is coupled to the drain of the third PMOSFET 226 (instead of the drain of the second NMOSFET 222 being coupled to the drain of the fourth NMOSFET 234).

FIG. 7 shows a truth table of the output signal formed at the output node 204 of the logic cell 246 of FIG. 6 for various logic states of the first input signal, $I_1$, and the second input signal, $I_2$, and for various logic states of the first output, $M_{OUT1}$, of the first memory cell 214 and of the second output, $M_{OUT2}$, of the second memory cell 228. "1" represents a logical high state, and "0" represents a logical low state. A first block 248 of the rows of the truth table of FIG. 7 is for the functional mode of the logic cell 246 when the first input signal, $I_1$, and the second input signal, $I_2$, are complements of each other. Referring to FIGS. 3 and 6, during such a functional mode, the first input signal, $I_1$, is the logic cell input signal I, and the second input signal, $I_2$, is the complement of the logic cell input signal, I*.

During the functional mode of the logic cell 246 of FIG. 6, the output signal at the output node 204 is determined by the logic states programmed within the first and second memory cells 214 and 228. The output of each of the first and second memory cells 214 and 228 is programmed to be one of a logical high state or a logical low state. Then, depending on such outputs $M_{OUT1}$ and $M_{OUT2}$ of the first and second memory cells 214 and 228, the output signal at the output node 204 for the logic cell 246 during the functional mode is determined according to the following truth table:

| $M_{OUT1}$ | $M_{OUT2}$ | OUTPUT |
|---|---|---|
| 0 | 0 | 1 |
| 0 | 1 | $I_2^* = I_1 = I$ |
| 1 | 0 | $I_1^* = I_2 = I^*$ |
| 1 | 1 | 0 |

Thus, in the functional mode, the logic cell 246 of FIG. 6 is also programmed to have one of four outputs, "0", "1", "I", or "I*" by programming the logic state at the respective output of each of the first and second memory cells 214 and 228, similar to the logic cell 200 of FIG. 2. In addition, the example embodiment of the logic cell 246 of FIG. 6 is also implemented in CMOS technology with the first and second pairs of stacked PMOSFETs 202 and 206 and with the first and second pairs of stacked NMOSFETs 208 and 210. Furthermore, the logic cell 246 of FIG. 6 is also a zero-power logic cell because each node of the circuit of the logic cell 246 of FIG. 6 is either charged up to a logical high state or is charged down to a logical low state without any steady-state current dissipation.

Figures 8, 9:
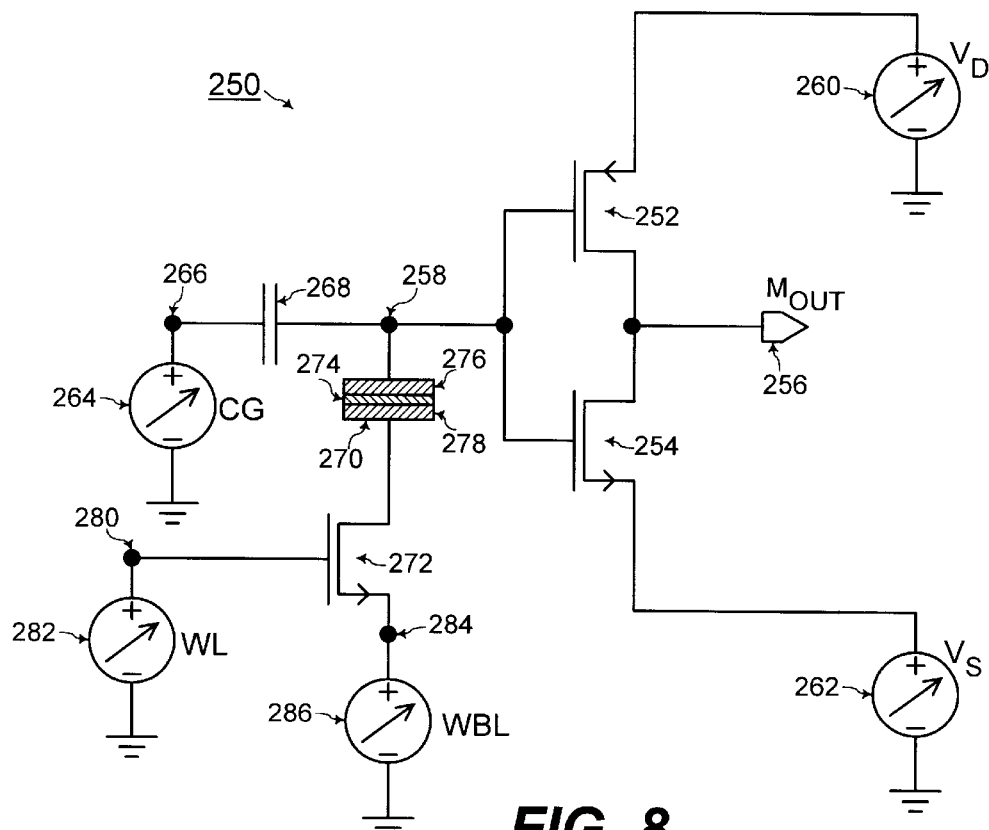
FIG. 8 shows a circuit diagram representation of an electrically erasable and programmable zero-power memory cell implemented in CMOS (complementary metal oxide semiconductor) technology, according to a second embodiment of the present invention.
FIG. 9 shows a truth table for the operation of the electrically erasable and programmable zero-power memory cell of FIG. 8, according to an embodiment of the present invention.

Referring to FIG. 8, a zero-power memory cell 250 that is electrically erasable and programmable is used for each of the first and second memory cells 214 and 228 of FIGS. 2 or 6, according to one embodiment of the present invention. However, the logic cell 200 of FIG. 2 or the logic cell 246 of FIG. 6 may be used with other types of programmable memory cells aside from the example implementation of FIG. 8, as would be apparent to one of ordinary skill in the art of programmable logic devices from the description herein.

The zero-power memory cell 250 of FIG. 8 includes a sense PMOSFET 252 and a sense NMOSFET 254. The drain of the sense PMOSFET 252 and the drain of the sense NMOSFET 254 are coupled together to form an output node 256 of the memory cell 250. The gate of the sense PMOSFET 252 and the gate of the sense NMOSFET 254 are coupled together to form a floating gate 258 of the memory cell 250. The source of the sense PMOSFET 252 is coupled to a first variable voltage generator 260 that provides a first variable voltage $V_D$, and the source of the sense NMOSFET 254 is coupled to a second variable voltage generator 262 that provides a second variable voltage $V_S$.

A control gate voltage source 264 is coupled to a control gate node 266, and a coupling capacitor 268 couples the control gate node 266 to the floating gate 258 of the memory cell 250. Furthermore, a tunneling capacitor 270 is coupled between the floating gate 258 and a drain of a write NMOSFET 272. The tunneling capacitor 270 is comprised of a tunneling oxide 274 disposed between overlapping polysilicon layers 276 and 278, according to an embodiment of the present invention. With sufficient voltage across the tunneling capacitor 270, charge carriers tunnel through the tunneling oxide 274, as known to one of ordinary skill in the art of electronics. In addition, the gate of the write NMOSFET 272 is coupled to a WL (write line) 280 having a WL (write line) voltage source 282 coupled thereon, and the source of the write NMOSFET 272 is coupled to a WBL (write bit line) 284 having a WBL (write bit line) voltage source 286 coupled thereon.

The electrically erasable and programmable zero-power memory cell 250 of FIG. 8 operates according to the voltages of the table of FIG. 9 in one embodiment of the present invention. During an erase operation, a positive voltage of about $V_{PP+}=12$ Volts is applied on the CG node from the CG voltage source 264, a positive voltage of about $V_{dd}=1.8$ Volts is applied on the WL (write line) 280, and a ground voltage of 0 Volts is applied on the WBL (write bit line) 284. With such an erase bias, the write transistor 272 turns on. Because of the high positive voltage of $V_{PP+}=12$ Volts on the CG node 266, electrons tunnel through the tunneling capacitor 270 to the floating gate 258 such that a negative voltage is stored on the floating gate 258. With such a negative voltage on the floating gate 258, the sense NMOSFET 254 remains turned off, and the sense PMOSFET 252 turns on such that a logical high state (i.e., a voltage level of $V_{dd}=1.8$ Volts) forms as the output signal $M_{OUT}$ on the output node 256 of the memory cell 250.

In addition, according to an embodiment of the present invention, a positive voltage of $V_{dd}=1.8$ Volts is generated by each of both the first and second variable voltage sources 260 and 262 (i.e., as $V_D$ and $V_S$) and are applied on the respective source of each of the sense PMOSFET 252 and the sense NMOSFET 254 during the erase operation. Such a positive voltage for the $V_D$ and $V_S$ applied on the respective source of each of the sense PMOSFET 252 and the sense NMOSFET 254 is advantageous for further attracting negative charge to the floating gate 258 during the erase operation. Thus, the positive voltage for the $V_D$ and $V_S$ ensures maximized capacitive coupling for the coupling capacitor 268 in forming a negative voltage on the floating gate 258 during the erase operation.

During a program operation, a ground voltage of 0 Volts is applied on the CG node from the CG voltage source 264, a positive voltage of about $V_{pp+}=12$ Volts is applied on the WL (write line) 280, and a positive voltage of about $V_{pp}=11$ Volts is applied on the WBL (write bit line) 284. With such a program bias, the write transistor 272 turns on. Because of the high positive voltage of $V_{PP}=11$ Volts on the WBL (write bit line) 284, electrons tunnel through the tunneling capacitor 270 away from the floating gate 258 and positive charge carriers tunnel through the tunnel capacitor 270 to the floating gate 258 such that a positive voltage is stored on the floating gate 258. With such a positive voltage on the floating gate 258, the sense PMOSFET 252 remains turned off and the sense NMOSFET 254 turns on such that a logical low state (i.e., a voltage level of 0 Volts) forms as the output signal $M_{OUT}$ on the output node 256 of the memory cell 250.

In addition, according to an embodiment of the present invention, a ground voltage of 0 Volts is generated by each of both the first and second variable voltage sources 260 and 262 (i.e., as $V_D$ and $V_S$) and are applied on the respective source of each of the sense PMOSFET 252 and the sense NMOSFET 254 during the program operation. Such a ground voltage for the $V_D$ and $V_S$ applied on the respective source of each of the sense PMOSFET 252 and the sense NMOSFET 254 is advantageous for further repulsing negative charge from the floating gate 258 and attracting positive charge carriers to the floating gate 258 during the program operation. Thus, the ground voltage for the $V_D$ and $V_S$ ensures maximized capacitive coupling for the coupling capacitor 268 in forming a positive voltage on the floating gate 258 during the program operation.

In a further embodiment of the present invention, the magnitude of the respective threshold voltage for each of the sense PMOSFET 252 and the sense NMOSFET 254 is higher than a magnitude of a threshold voltage of standard process P-channel and N-channel transistors. For example, for a CMOS technology using a rail-to-rail voltage ($V_{CC}-V_{SS}$) of about 1.8 Volts, the magnitude of the threshold voltage for the P-channel and N-channel transistors in the standard CMOS fabrication process is about 0.5 Volts (i.e., about ¼ of the rail-to-rail voltage of 1.8 Volts), as known to one of ordinary skill in the art of integrated circuit fabrication. However, according to one embodiment of the present invention, the magnitude of the threshold voltage for each of the sense PMOSFET 252 and the sense NMOSFET 254 is about ½ of a minimum value of the possible range of the rail-to-rail voltage.

The rail-to-rail voltage ($V_{CC}-V_{SS}$) for a CMOS process has a range of possible values because of variations in process and environmental parameters, as known to one of ordinary skill in the art of integrated circuit fabrication. For example, the range of possible values of the rail-to-rail voltage ($V_{CC}-V_{SS}$) may be 1.8 Volts±0.2 Volts. In that case, the minimum value of the possible range of the rail-to-rail voltage is 1.6 Volts. For the memory cell 250 fabricated in the CMOS process having such a range of possible values of the rail-to-rail voltage, the magnitude of the respective threshold voltage for each of the sense PMOSFET 252 and the sense NMOSFET 254 is about ½ of the minimum value of the possible range of the rail-to-rail voltage (i.e., 0.8 Volts=½ of 1.6 Volts), according to one embodiment of the present invention. Generally, the sum of the magnitudes of each of the respective threshold voltage for the sense PMOSFET 252 and the sense NMOSFET 254 is equal to or greater than the minimum value of the possible range of the rail-to-rail voltage applied across the sources of the sense PMOSFET 252 and the sense NMOSFET 254 during a read operation of the memory cell, according to an embodiment of the present invention.

Figure 10:
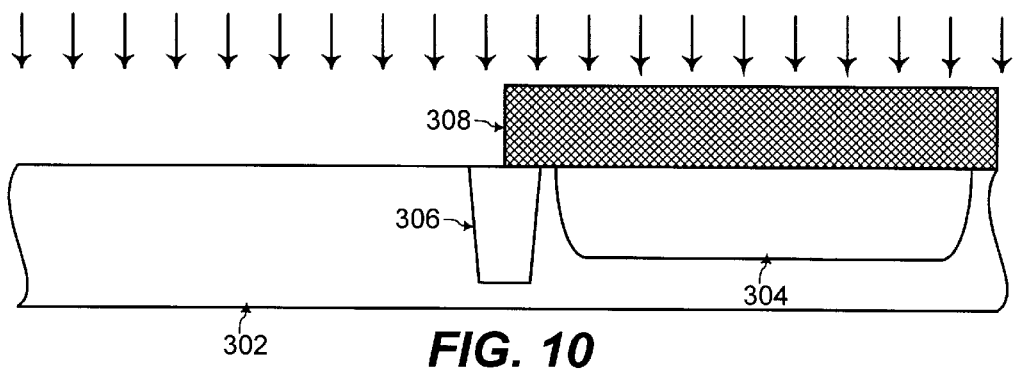
FIGS. 10, 11, and 12 show cross-sectional views for illustrating a respective channel doping and a respective gate oxide thickness for each of the P-channel and N-channel sense transistors of the electrically erasable and programmable zero-power memory cell of FIG. 8, according to an embodiment of the present invention.

Such a higher magnitude of the threshold voltage for each of the sense PMOSFET 252 and the sense NMOSFET 254 is achieved by adjusting the respective gate oxide thickness and the concentration of the respective channel doping for each of the sense PMOSFET 252 and the sense NMOSFET 254. Referring to FIG. 10, the sense NMOSFET 254 is fabricated within a P-type substrate 302, and the sense PMOSFET 252 is fabricated within an N-well 304 formed within the P-type substrate 302. A shallow trench isolation structure 306 electrically isolates the sense PMOSFET 252 and the sense NMOSFET 254. Processes for fabricating such integrated circuit device structures are known to one of ordinary skill in the art of integrated circuit fabrication.

Referring to FIG. 10, before formation of the gate oxide for the sense PMOSFET 252 and the sense NMOSFET 254, a first channel doping implantation is performed for implanting a first channel dopant into the portion of the P-type substrate 302 for forming the sense NMOSFET 254. The first channel dopant that is implanted for an N-channel region of the sense NMOSFET 254 is comprised of a P-type dopant such as boron for example for adjusting the threshold voltage of the sense NMOSFET 254. A higher concentration of such a P-type channel dopant increases the threshold voltage of an NMOSFET. A first masking structure 308 which is comprised of photoresist material according to one embodiment of the present invention covers the N-well 304 such that the first channel dopant is not implanted into the N-well 304.

Figure 11:
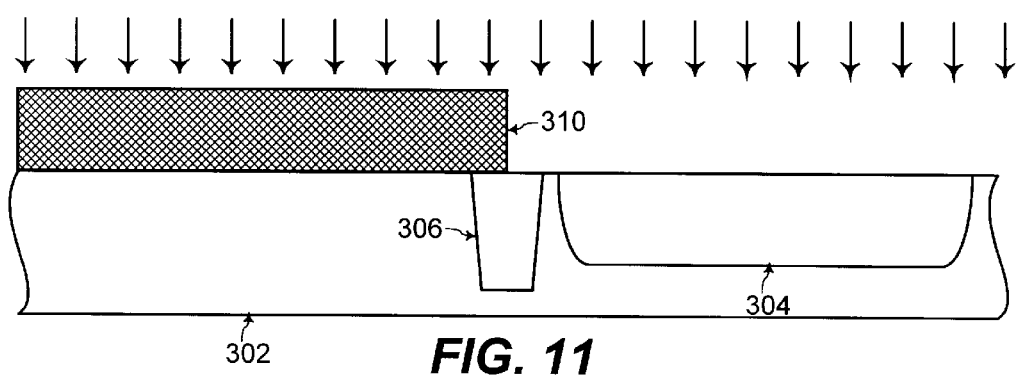

Referring to FIG. 11, a second channel doping implantation is performed for implanting a second channel dopant into the N-well for forming the sense PMOSFET 252. The second channel dopant that is implanted for a P-channel region of the sense PMOSFET 252 is comprised of an N-type dopant such as phosphorous and/or arsenic for example for adjusting the threshold voltage of the sense PMOSFET 252. A higher concentration of such an N-type channel dopant increases the threshold voltage of a PMOSFET. A second masking structure 310 which is comprised of photoresist material according to one embodiment of the present invention covers the portion of the P-type substrate 302 for forming the NMOSFET therein such that the second channel dopant is not implanted into that portion of the P-type substrate 302. Implantation processes for the first and second channel doping implantations of FIGS. 10 and 11 are known to one of ordinary skill in the art of integrated circuit fabrication.

Figure 12:
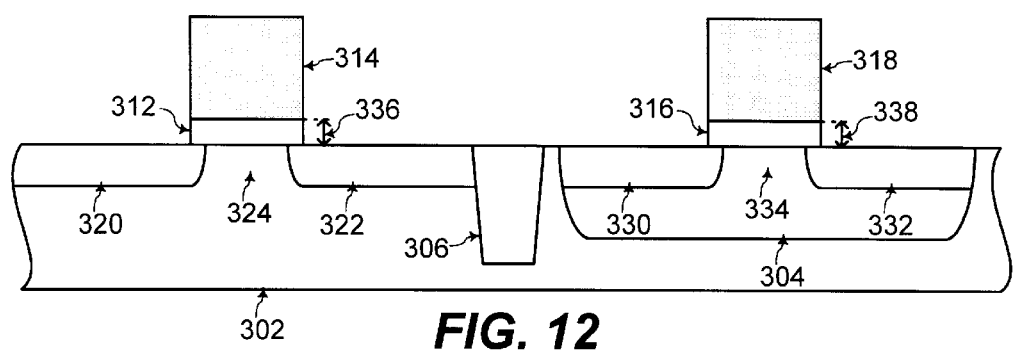

Referring to FIG. 12, after the first and second channel doping implantations, an N-channel gate oxide 312 and an N-channel gate structure 314 are formed on the portion of the P-type substrate 302 for forming the sense NMOSFET 254, and a P-channel gate oxide 316 and a P-channel gate structure 318 are formed on the N-well 304. In addition, an N-channel drain 320 and an N-channel source 322 are formed for the sense NMOSFET 254 with an N-channel region 324 being formed beneath the N-channel gate oxide 312 between the N-channel drain 320 and source 322. Similarly, a P-channel drain 330 and a P-channel source 332 are formed for the sense PMOSFET 252 with a P-channel region 334 being formed beneath the P-channel gate oxide 316 between the P-channel drain 330 and source 332. Processes for formation of such structures for an NMOSFET and for a PMOSFET are known to one of ordinary skill in the art of integrated circuit fabrication.

The N-channel gate oxide 312 has a first thickness 336, and the P-channel gate oxide 316 has a second thickness 338. A higher gate oxide thickness of a MOSFET increases the magnitude of the threshold voltage of the MOSFET. The gate oxide thickness for a low voltage MOSFET is approximately 40 Å, and the gate oxide thickness for a high voltage MOSFET is approximately 90 Å. As known to one of ordinary skill in the art of integrated circuit fabrication, the high voltage MOSFET has a higher gate oxide thickness than the low voltage MOSFET to prevent gate oxide degradation in the high voltage MOSFET from higher bias voltages applied on the high voltage MOSFET.

In the prior art, for a rail voltage $V_{CC}$ of about 1.8 Volts, a high voltage MOSFET or a low voltage MOSFET has a magnitude of a threshold voltage of about 0.5 Volts. To achieve such a constant magnitude of the threshold voltage, the concentration of the channel dopant for a high voltage MOSFET is lower than the concentration of the channel dopant for a low voltage MOSFET.

For example, for a high voltage NMOSFET having a higher gate oxide thickness of about 90 Å with the channel dopant being comprised of boron, the concentration of the channel dopant is about $3.5 \times 10^{12}/cm^2$ to attain a magnitude of the threshold voltage of the high voltage NMOSFET to be about 0.5 Volts. On the other hand, for a low voltage NMOSFET having a lower gate oxide thickness of about 40 Å with the channel dopant being comprised of boron, the concentration of the channel dopant is about $1.1 \times 10^{13}/cm^2$ to attain a magnitude of the threshold voltage of the low voltage NMOSFET to also be about 0.5 Volts.

Similarly, for a high voltage PMOSFET having a higher gate oxide thickness of about 90 Å with the channel dopant being comprised of phosphorous and/or arsenic, the concentration of the channel dopant is about $2.7 \times 10^{12}/cm^2$ to attain a magnitude of the threshold voltage of the high voltage PMOSFET to be about 0.5 Volts. On the other hand, for a low voltage PMOSFET having a lower gate oxide thickness of about 40 Å with the channel dopant being comprised of phosphorous and/or arsenic, the concentration of the channel dopant is about $1.1 \times 10^{13}/cm^2$ to attain a magnitude of the threshold voltage of the low voltage PMOSFET to also be about 0.5 Volts.

In an embodiment of the present invention, the sense PMOSFET 252 and the sense NMOSFET 254 have a higher magnitude of threshold voltage that is about 0.8 Volts by having the higher gate oxide thickness of a high voltage MOSFET in conjunction with a higher concentration of channel dopant for a low voltage MOSFET. Thus, referring to FIG. 7, the first thickness 336 of the N-channel gate oxide 312 for the sense NMOSFET 254 is about 90 Å. In addition, referring to FIG. 5, the concentration of the P-type channel dopant such as boron for example for the sense NMOSFET 254 is about $1.1 \times 10^{13}/cm^2$ to attain a magnitude of the threshold voltage of the sense NMOSFET 254 that is about 0.8 Volts according to one embodiment of the present invention.

Similarly, referring to FIG. 12, the second thickness 338 of the P-channel gate oxide 316 for the sense PMOSFET 252 is about 90 Å. Furthermore, referring to FIG. 11, the concentration of the N-type channel dopant such as phosphorous and/or arsenic for example for the sense PMOSFET 252 is about $1.1 \times 10^{13}/cm^2$ to attain a magnitude of the threshold voltage of the sense PMOSFET 252 that is about 0.8 Volts according to one embodiment of the present invention.

Referring to FIG. 8, a higher magnitude of the respective threshold voltage for each of the sense PMOSFET 252 and the sense NMOSFET 254 is advantageous for ensuring that the sense PMOSFET 252 and the sense NMOSFET 254 are turned off at proper times to minimize undesired current dissipation in the memory cell 250. In addition, a higher magnitude of the respective threshold voltage for each of the sense PMOSFET 252 and the sense NMOSFET 254 is advantageous for operation of the memory cell 250 with a lower magnitude of the voltage stored on the floating gate 258 of the memory cell 250.

For example, referring to FIG. 8, assume that −0.5 Volts is stored on the floating gate 258 of the memory cell 250 after the erase operation, and that +0.5 Volts is stored on the floating gate 258 of the memory cell 250 after the program operation. During the read operation (i.e., the normal operation) after an erase operation, a voltage of 0.9 Volts is applied on the WBL (write bit line) 284. In that case, a voltage of 0.4 (=0.9−0.5) Volts forms at the floating gate 258 of the memory cell 250 such that the source to gate voltage $V_{SG}$ of the sense PMOSFET 252 is about 1.4 Volts and such that the gate to source voltage $V_{GS}$ of the sense NMOSFET 254 is about 0.4 Volts.

During the read operation after an erase operation, it is desired that the sense PMOSFET 252 turn on and that the sense NMOSFET 254 remain turned off. If the magnitude of the respective threshold voltage of each of the sense PMOSFET 252 and the sense NMOSFET 254 is only about 0.5 Volts, then the sense PMOSFET 252 is turned on with the source to gate voltage $V_{SG}$ of the sense PMOSFET 252 being about 1.4 Volts. However, with the gate to source voltage $V_{GS}$ of the sense NMOSFET 254 being about 0.4 Volts, the NMOSFET 254 may also turn on in weak inversion when the magnitude of the threshold voltage of sense NMOSFET 254 is as low as 0.5 Volts. When the PMOSFET 252 is turned on and when the NMOSFET 254 is also turned on in weak inversion, current is undesirably dissipated through the memory cell 250 such that the memory cell 250 is disadvantageously no longer a zero-power memory cell.

For ensuring that the sense NMOSFET 254 remains turned off during such a read operation, a more negative voltage may be stored on the floating gate 258 during the prior erase operation. However, such a solution disadvantageously requires higher voltages and longer time periods of the erasing operation. Rather, according to one embodiment of the present invention, a higher threshold voltage of the sense NMOSFET 254 ensures that the sense NMOSFET 254 remains turned off during such a read operation. When the threshold voltage of the sense NMOSFET 254 is about 0.8 Volts, the sense NMOSFET 254 remains turned off when the gate to source voltage $V_{GS}$ of the sense NMOSFET 254 is about 0.4 Volts during such a read operation.

In a similar manner, a higher magnitude of the threshold voltage of the sense PMOSFET 252 further ensures that the sense PMOSFET 252 remains turned off when the sense NMOSFET 254 turns on during the read operation after a program operation. Thus, a higher magnitude of the respective threshold voltage for each of the sense PMOSFET 252 and the sense NMOSFET 254 further ensures that one of the sense PMOSFET 252 and the sense NMOSFET 254 remains turned off during a read operation to minimize undesired current dissipation through the memory cell 250 such that the memory cell 250 is a zero-power memory cell. In addition, a higher magnitude of the respective threshold voltage for each of the sense PMOSFET 252 and the sense NMOSFET 254 further ensures that one of the sense PMOSFET 252 and the sense NMOSFET 254 remains turned off during a read operation with a lower magnitude of voltage stored on the floating gate 258 during the erase and program operations such that lower voltages and time periods advantageously may be used during the erase and program operations.

Referring to FIGS. 2, 6, and 8, the memory cell 250 of FIG. 8 that is a zero-power memory cell is used as each of the first and second memory cells 214 and 228 in the zero-power logic cell 200 of FIG. 2 or the zero-power logic cell 246 of FIG. 6. Either one of the logic cell 200 of FIG. 2 with two of the memory cell 250 of FIG. 8 or the logic cell 246 of FIG. 6 with two of the memory cell 250 of FIG. 8 is advantageously used to implement a zero-power logic cell in a programmable logic device.

Figure 13:
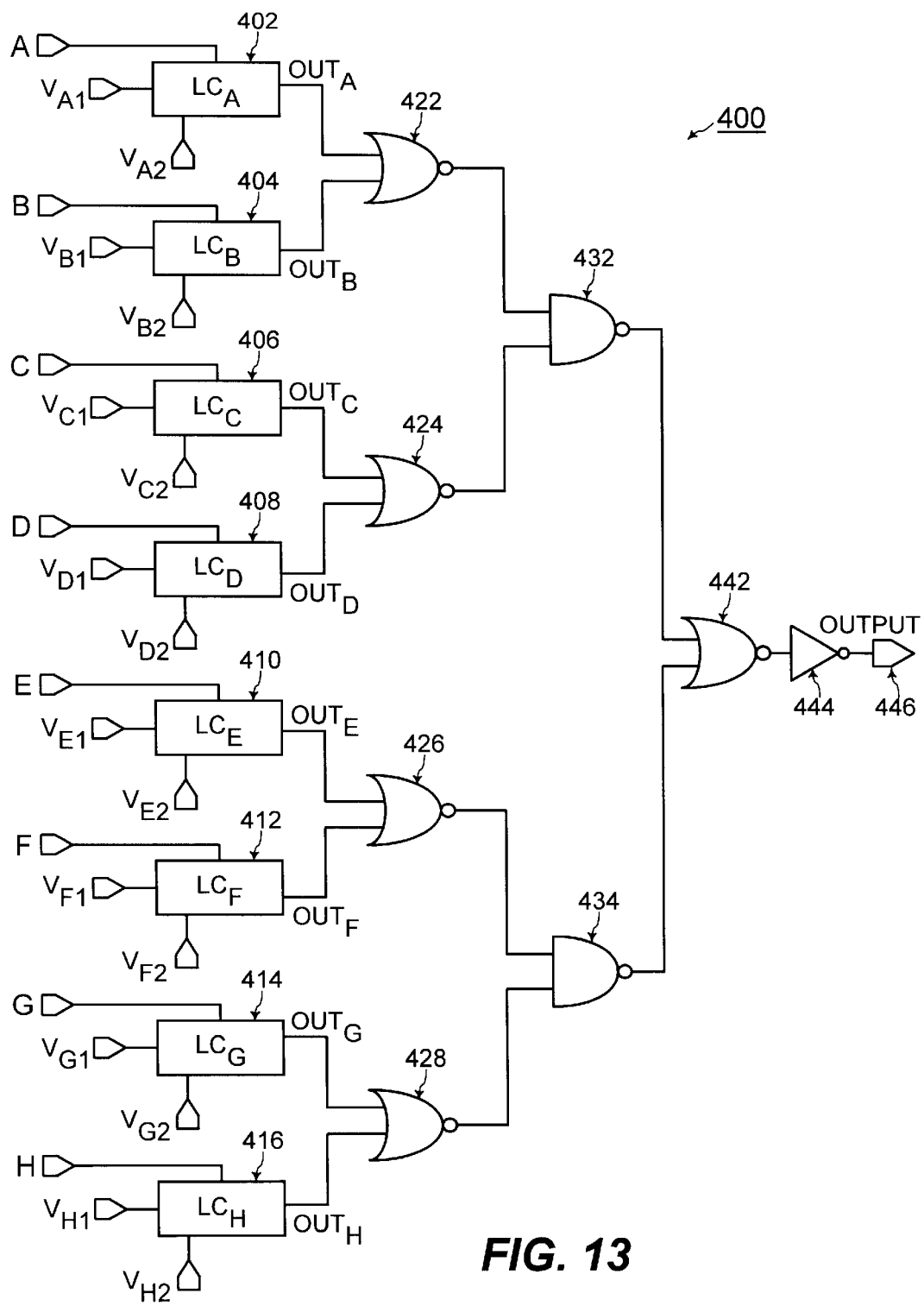
FIG. 13 shows a programmable OR gate comprising a plurality of logic cells with each logic cell having the circuit topology of FIG. 2, according to an embodiment of the present invention.

For example, referring to FIG. 13, an eight-input programmable OR gate 400 includes a first zero-power programmable logic cell 402, a second zero-power programmable logic cell 404, a third zero-power programmable logic cell 406, a fourth zero-power programmable logic cell 408, a fifth zero-power programmable logic cell 410, a sixth zero-power programmable logic cell 412, a seventh zero-power programmable logic cell 414, and an eighth zero-power programmable logic cell 416. Each of these logic cells 402, 404, 406, 408, 410, 412, 414, and 416 has the implementation of the programmable zero-power logic cell 200 of FIG. 2 or the programmable zero-power logic cell 246 of FIG. 6, each with a respective input signal selection circuit (implemented as the input signal selection circuit 236 of FIG. 3) and with the first and second memory cells 214 and 228 being implemented as the memory cell 250 of FIG. 8.

Further referring to FIGS. 2, 3, 6, and 13, the first logic cell 402 inputs a first logic cell input signal A as the logic cell input signal, I, of the respective input signal selection circuit corresponding to the first logic cell 402. Thus, the first logic cell 402 provides an output signal $OUT_A$ as one of the first logic cell input signal A, the complement of the first logic cell input signal A*, a logical high state "1", or a logical low state "0" depending on whether the logical low or high state is programmed or erased within each of the respective two memory cells of the first logic cell 402, during the functional mode of the programmable OR gate 400.

Similarly, the second logic cell 404 inputs a second logic cell input signal B as the logic cell input signal, I, of the respective input signal selection circuit corresponding to the second logic cell 404. Thus, the second logic cell 404 provides an output signal $OUT_B$ as one of the second logic cell input signal B, the complement of the second logic cell input signal B*, a logical high state "1", or a logical low state "0" depending on whether the logical low or high state is programmed or erased within each of the respective two memory cells of the second logic cell 404, during the functional mode of the programmable OR gate 400.

In addition, the third logic cell 406 inputs a third logic cell input signal C as the logic cell input signal, I, of the respective input signal selection circuit corresponding to the third logic cell 406. Thus, the third logic cell 406 provides an output signal $OUT_C$ as one of the third logic cell input signal C, the complement of the third logic cell input signal C*, a logical high state "1", or a logical low state "0" depending on whether the logical low or high state is programmed or erased within each of the respective two memory cells of the third logic cell 406, during the functional mode of the programmable OR gate 400.

Similarly, the fourth logic cell 408 inputs a fourth logic cell input signal D as the logic cell input signal, I, of the respective input signal selection circuit corresponding to the fourth logic cell 408. Thus, the fourth logic cell 408 provides an output signal $OUT_D$ as one of the fourth logic cell input signal D, the complement of the fourth logic cell input signal D*, a logical high state "1", or a logical low state "0" depending on whether the logical low or high state is programmed or erased within each of the respective two memory cells of the fourth logic cell 408, during the functional mode of the programmable OR gate 400.

Furthermore, the fifth logic cell 410 inputs a fifth input signal E as the logic cell input signal, I, of the respective input signal selection circuit corresponding to the fifth logic cell 410. Thus, the fifth logic cell 410 provides an output signal $OUT_E$ as one of the fifth logic cell input signal E, the complement of the fifth logic cell input signal E*, a logical high state "1", or a logical low state "0" depending on whether the logical low or high state is programmed or erased within each of the respective two memory cells of the fifth logic cell 410, during the functional mode of the programmable OR gate 400.

Similarly, the sixth logic cell 412 inputs a sixth input signal F as the logic cell input signal, I, of the respective input signal selection circuit corresponding to the sixth logic cell 412. Thus, the sixth logic cell 412 provides an output signal $OUT_F$ as one of the sixth logic cell input signal F, the complement of the sixth logic cell input signal F*, a logical high state "1", or a logical low state "0" depending on whether the logical low or high state is programmed or erased within each of the respective two memory cells of the sixth logic cell 412, during the functional mode of the programmable OR gate 400.

Also, the seventh logic cell 414 inputs a seventh input signal G as the logic cell input signal, I, of the respective input signal selection circuit corresponding to the seventh logic cell 414. Thus, the seventh logic cell 414 provides an output signal $OUT_G$ as one of the seventh logic cell input signal G, the complement of the seventh logic cell input signal G*, a logical high state "1", or a logical low state "0" depending on whether the logical low or high state is programmed or erased within each of the respective two memory cells of the seventh logic cell 414, during the functional mode of the programmable OR gate 400.

Similarly, the eighth logic cell 416 inputs an eighth input signal H as the logic cell input signal, I, of the respective input signal selection circuit corresponding to the eighth logic cell 416. Thus, the eighth logic cell 416 provides an output signal $OUT_H$ as one of the eighth logic cell input signal H, the complement of the eighth logic cell input signal H*, a logical high state "1", or a logical low state "0" depending on whether the logical low or high state is programmed or erased within each of the respective two memory cells of the eighth logic cell 416, during the functional mode of the programmable OR gate 400.

The outputs, $OUT_A$ and $OUT_B$, of the first and second logic cells 402 and 404 are inputs to a first 2-input NOR gate 422. The outputs, $OUT_C$ and $OUT_D$, of the third and fourth logic cells 406 and 408 are inputs to a second 2-input NOR gate 424. The outputs, $OUT_E$ and $OUT_F$, of the fifth and sixth logic cells 410 and 412 are inputs to a third 2-input NOR gate 426. The outputs, $OUT_G$ and $OUT_H$, of the seventh and eighth logic cells 414 and 416 are inputs to a fourth 2-input NOR gate 428.

The outputs of the first and second NOR gates 422 and 424 are inputs to a first 2-input NAND gate 432. The outputs of the third and fourth NOR gates 426 and 428 are inputs to a second 2-input NAND gate 434. The outputs of the first and second NAND gates 432 and 434 are inputs to a fifth 2-input NOR gate 442. The output of the fifth NOR gate 442 is inverted through an inverter 444 to form the OUTPUT signal at the output node 446. The OUTPUT signal at the output node 446 of the programmable OR gate 400 of FIG. 13 is expressed as follows:

$$OUTPUT = OUT_A + OUT_B + OUT_C + OUT_D + OUT_E + OUT_F + OUT_G + OUT_H$$

Thus, the outputs of each of the logic cells 402, 404, 406, 408, 410, 412, 414, and 416 are OR'ed together to form the OUTPUT signal at the output node 446 of the programmable OR gate 400. Referring to FIGS. 2, 6, and 13, for programming the programmable OR gate 400 of FIG. 13, the respective two memory cells 214 and 218 of each of the logic cells 402, 404, 406, 408, 410, 412, 414, and 416 are each programmed or erased to output a logical low state or a logical high state, respectively, for a desired respective output signal at the logic cell during the functional mode of the programmable OR gate 400.

Figure 14:
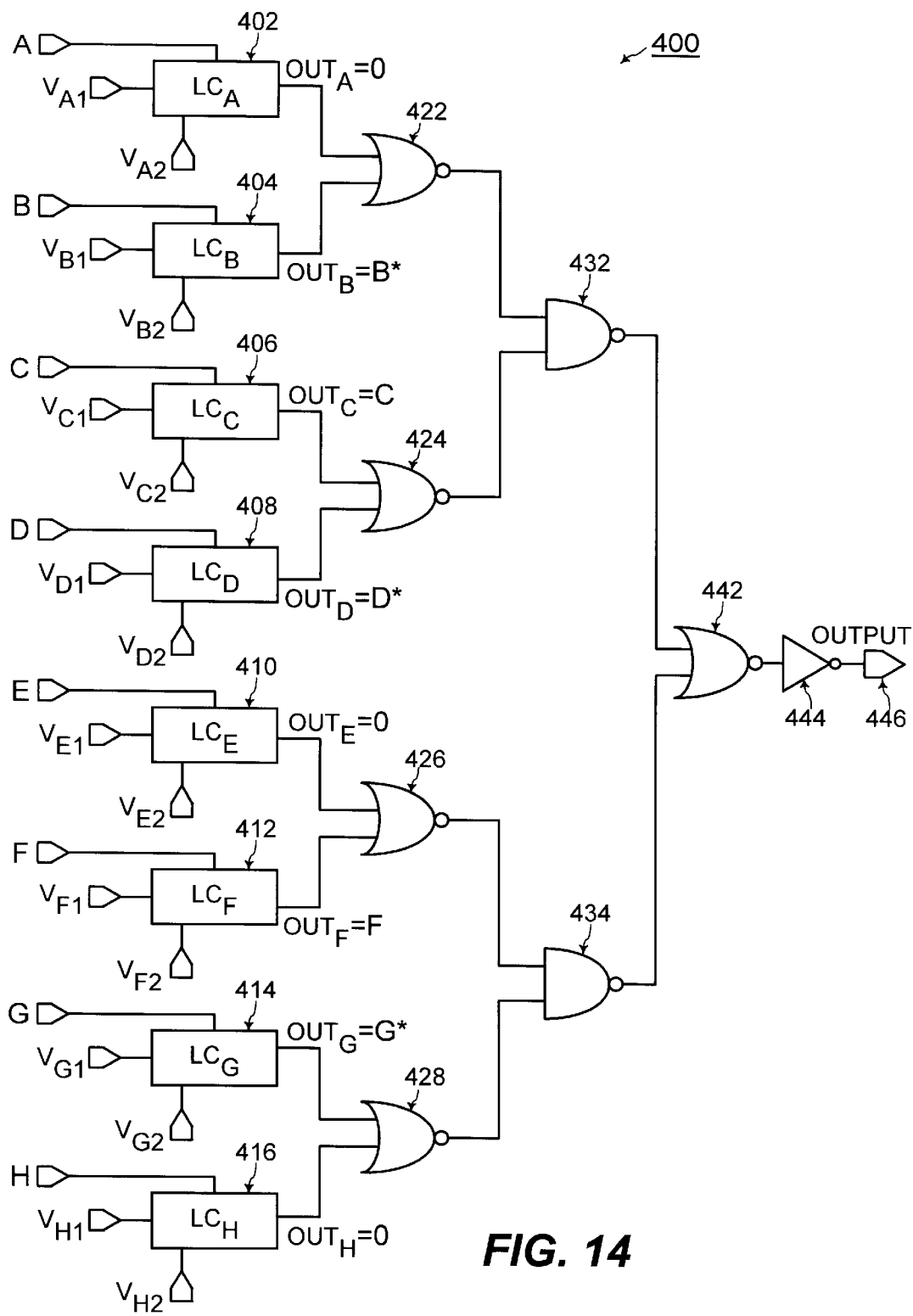
FIG. 14 shows example programmed logic states for the plurality of logic cells of FIG. 13.

For example, referring to FIG. 14, the respective two memory cells of the first logic cell 402 are each erased or programmed such that the output of the first logic cell $OUT_A$="0" (i.e., a logical low state). The respective two memory cells of the second logic cell 404 are each erased or programmed such that the output of the second logic cell $OUT_B$=B* (i.e., the complement of the second input signal B). The respective two memory cells of the third logic cell 406 are each erased or programmed such that the output of the third logic cell $OUT_C$=C (i.e., the third input signal C). The respective two memory cells of the fourth logic cell 408 are each erased or programmed such that the output of the fourth logic cell $OUT_D$=D* (i.e., the complement of the fourth input signal D).

In addition, the respective two memory cells of the fifth logic cell 410 are each erased or programmed such that the output of the fifth logic cell $OUT_E$="0" (i.e., a logical low state). The respective two memory cells of the sixth logic cell 412 are each erased or programmed such that the output of the sixth logic cell $OUT_F$=F (i.e., the sixth input signal F). The respective two memory cells of the seventh logic cell 414 are each erased or programmed such that the output of the seventh logic cell $OUT_G$=G*. (i.e., the complement of the seventh input signal G). The respective two memory cells of the eighth logic cell 416 are each erased or programmed such that the output of the eighth logic cell $OUT_H$="0" (i.e., a logical low state).

In this example, the OUTPUT signal of the programmable OR gate 400 of FIG. 14 during the functional mode of the programmable OR gate. 400 is expressed as follows:

$$OUTPUT = B^* + C + D^* + F + G^*$$

In this manner, the respective two memory cells of each of the logic cells 402, 404, 406, 408, 410, 412, 414, and 416 may each be erased or programmed to provide an OR functionality of any combination of the eight input signals A, B, C, D, E, F, G, and H and their complements A*, B*, C*, D*, E*, F*, G*, and H*, respectively, with the programmable OR gate 400, as would be apparent to one of ordinary skill in the art of electronics from the description herein.

Note that if the output of the respective logic cell for a logic cell input signal is set to be a logical low state, "0", then the input signal does not appear in the expression of the OUTPUT signal for the programmable OR gate 400. If the output of any of the logic cells 402, 404, 406, 408, 410, 412, 414, and 416 is set to a logical high state, then the OUTPUT signal is automatically a logical high state for the programmable OR gate 400.

During the verify mode of the programmable OR gate 400 (instead of the functional mode of the programmable OR gate 400), the output of each of the respective two memory cells of one of the logic cells 402, 404, 406, 408, 410, 412, 414, and 416 is determined. If the verify mode is to be used with the programmable OR gate 400, the logic cell 200 of FIG. 2 (rather than the logic cell 246 of FIG. 6) is advantageously used for each of the logic cells 402, 404, 406, 408, 410, 412, 414, and 416 of the programmable OR gate 400. Referring to the truth table of FIG. 5 for the logic cell 200 of FIG. 2, within a second block 251 of the truth table of FIG. 5 when the first input signal $I_1$ and the second input signal $I_2$ are both a logical high state "1", the output of the logic cell 200 is a logical low state "0", irrespective of the logical states of the output signals $M_{OUT1}$ and $M_{OUT2}$ of the memory cells.

In a preferred embodiment of the present invention, each of the logic cells 402, 404, 406, 408, 410, 412, 414, and 416 of the programmable OR gate 400 is implemented as the logic cell 200 of FIG. 2 with a respective input signal selection circuit for each logic cell (implemented as the input signal selection circuit 236 of FIG. 4). In addition, the first and second input signals $I_1$ and $I_2$ for each of the logic cells 402, 404, 406, 408, 410, 412, 414, and 416 are initially set to a logical high state "1" to result in a logical low state "0" at the respective output of each of the logic cells. Referring to the input signal selection circuit 236 of FIG. 4, the first switch 240 is switched to couple the first logic state input node 238 having the first logic state $V_1$ to the input of the first inverter 241, and the second switch 242 is switched to couple the second logic state $V_2$ at the second logic state input node 239 to the second input node 224 of the logic cell, during the verify mode.

Referring to FIG. 13, a first logic state $V_{A1}$ and a second logic state $V_{A2}$ are coupled to the first and second logic state input nodes 238 and 239, respectively, of a respective input signal selection circuit (implemented as the input signal selection circuit 236 of FIG. 4) corresponding to the first logic cell 402. Similarly, a first logic state $V_{B1}$ and a second logic state $V_{B2}$ are coupled to the first and second logic state input nodes 238 and 239, respectively, of a respective input signal selection circuit corresponding to the second logic cell 404. A first logic state $V_{C1}$ and a second logic state $V_{C2}$ are coupled to the first and second logic state input nodes 238 and 239, respectively, of a respective input signal selection circuit corresponding to the third logic cell 406. A first logic state $V_{D1}$ and a second logic state $V_{D2}$ are coupled to the first and second logic state input nodes 238 and 239, respectively, of a respective input signal selection circuit corresponding to the fourth logic cell 408.

In like manner, a first logic state $V_{E1}$ and a second logic state $V_{E2}$ are coupled to the first and second logic state input nodes 238 and 239, respectively, of a respective input signal selection circuit corresponding to the fifth logic cell 410. A first logic state $V_{F1}$ and a second logic state $V_{F2}$ are coupled to the first and second logic state input nodes 238 and 239, respectively, of a respective input signal selection circuit corresponding to the sixth logic cell 412. A first logic state $V_{G1}$ and a second logic state $V_{G2}$ are coupled to the first and second logic state input nodes 238 and 239, respectively, of a respective input signal selection circuit corresponding to the seventh logic cell 414. A first logic state $V_{H1}$ and a second.logic state $V_{H2}$ are coupled to the first and second logic state input nodes 238 and 239, respectively, of a respective input signal selection circuit corresponding to the eighth logic cell 416.

During the verify mode, the respective first and second logic states of each of the logic cells 402, 404, 406, 408, 410, 412, 414, and 416 (i.e., $V_{A1}$, $V_{A2}$, $V_{B1}$, $V_{B2}$, $V_{C1}$, $V_{C2}$, $V_{D1}$, $V_{D2}$, $V_{E1}$, $V_{E2}$, $V_{F1}$, $V_{F2}$, $V_{G1}$, $V_{G2}$, $V_{H1}$, and $V_{H2}$) are initially set to a logical high state "1" such that the respective output (i.e., $OUT_A$, $OUT_B$, $OUT_C$, $OUT_D$, $OUT_E$, $OUT_F$, $OUT_G$, and $OUT_H$) of each of the logic cells is a logical low state "0".

In this manner, the output signal at the output node 446 of the programmable OR gate 400 is initially a logical low state "0" during the verify mode. Then, for verifying the output of each of the two memory cells 214 and 228 of any one of the logic cells 402, 404, 406, 408, 410, 412, 414, and 416, the respective first and second logic states $V_1$ and $V_2$ are altered for that logic cell. Referring to FIGS. 2, 4, and 5, for verifying the first output $M_{OUT1}$ of the first memory cell 214, the first logic state $V_1=I_1$ is set to a logical low state while the second logic state $V_2=I_2$ remains set to the logical high state. Referring to FIG. 5, in that case, the output signal of a logic cell is a logical high state if the first output $M_{OUT1}$ of the first memory cell 214 is a logical low state, and is a logical low state if the first output $M_{OUT1}$ of the first memory cell 214 is a logical high state.

Alternatively, referring to FIGS. 2, 4, and 5, for verifying the second output $M_{OUT2}$ of the second memory cell 228, the second logic state $V_2=I_2$ is set to a logical low state while the first logic state $V_1=I_1$ remains set to the logical high state. Referring to FIG. 5, in that case, the output signal of a logic cell is a logical high state if the second output $M_{OUT2}$ of the second memory cell 228 is a logical low state, and is a logical low state if the second output $M_{OUT2}$ of the second memory cell 228 is a logical high state.

Referring to the programmable OR gate 400 of FIG. 13, for verifying the first and second outputs $M_{OUT1}$ and $M_{OUT2}$ of any one logic cell, the respective first and second logic states $V_1$ and $V_2$ of that logic cell are varied while the respective first and second logic states $V_1$ and $V_2$ of the other logic cells of the programmable OR gate 400 are maintained at the logical high state. For example, assume that the first and second outputs $M_{OUT1}$ and $M_{OUT2}$ of the memory cells within the third logic cell 406 are verified. In that case, the respective first and second logic states $V_1$ and $V_2$ of each of the first, second, fourth, fifth, sixth, seventh, and eighth logic cells, 402, 404, 408, 410, 412, 414, and 416 (i.e., $V_{A1}$, $V_{A2}$, $V_{B1}$, $V_{B2}$, $V_{D1}$, $V_{D2}$, $V_{E1}$, $V_{E2}$, $V_{F1}$, $V_{F2}$, $V_{G1}$, $V_{G2}$, $V_{H1}$, and $V_{H2}$) are set to a logical high state "1". Thus, the respective output (i.e., $OUT_A$, $OUT_B$, $OUT_D$, $OUT_E$, $OUT_F$, $OUT_G$, and $OUT_H$) of each of the logic cel the output signal at the output node 446 of the programmable OR gate 200.

In addition, for verifying the first output $M_{OUT1}$ of the first memory cell 214 of the third logic cell 406, the first logic state $V_{C1}=I_1$ is set to a logical low state while the second logic state $V_{C2}=I_2$ remains set to a logical high state. Referring to FIGS. 5 and 13, in that case, the output signal $OUT_C$ of the third logic cell 406 (and thus the output signal at the output node 446 of the programmable OR gate 400) is a logical high state if the first output $M_{OUT1}$ of the first memory cell 214 is a logical low state, and is a logical low state if the first output $M_{OUT1}$ of the first memory cell 214 is a logical high state.

Alternatively, for verifying the second output $M_{OUT2}$ of the second memory cell 228 of the third logic cell 406, the second logic state $V_{C2}=I_2$ is set to a logical low state while the first logic state $V_{C1}=I_1$ remains set to a logical high state. Referring to FIGS. 5 and 13, in that case, the output signal $OUT_C$ of the third logic cell 406 (and thus the output signal at the output node 446 of the programmable OR gate 400) is a logical high state if the second output $M_{OUT2}$ of the second memory cell 228 is a logical low state, and is a logical low state if the second output $M_{OUT2}$ of the second memory cell 228 is a logical high state.

In this manner, the respective logical states of each of the output signals $M_{OUT1}$ and $M_{OUT2}$ of the respective first and second memory cells within the third logic cell 406 is determined during the verify mode. In like manner, the output signals $M_{OUT1}$ and $M_{OUT2}$ of each respective first and second memory cells within each of the other logic cells 402, 404, 408, 410, 412, 414, and 416 may be individually determined during the verify mode, as would be apparent to one of ordinary skill in the art of electronics from the description herein.

Referring to FIG. 13, when verifying the output signals $M_{OUT1}$ and $M_{OUT2}$ of the memory cells within the third logic cell 406, the respective output signals (i.e., $OUT_A$, $OUT_B$, $OUT_D$, $OUT_E$, $OUT_F$, $OUT_G$, and $OUT_H$) of each of the other logic cells 402, 404, 408, 410, 412, 414, and 416 is a logical low state "0" to not affect the output signal at the output node 446 of the programmable OR gate 200. Referring to the truth table of FIG. 5 for the logic cell 200 of FIG. 2 and to the truth table of FIG. 7 for the logic cell 246 of FIG. 6, the rows of the second block 251 of the truth table of FIG. 5 has the logical low state "0" as the output, irrespective of the logical states of the outputs $M_{OUT1}$ and $M_{OUT2}$ of the memory cells. Therefore, the logic cell 200 of FIG. 2 (rather than the logic cell 246 of FIG. 6) is more amenable for implementing the programmable OR gate 400 with a verify mode.

Similarly, the programmable OR gate 400 of FIG. 13 is a programmable NOR gate with removal of the inverter 444 such that the logic cells 402, 404, 406, 408, 410, 412, 414, and 416 readily form a programmable NOR gate. As would be apparent to one of ordinary skill in the art of electronics from the description herein, the logic cell 200 of FIG. 2 (rather than the logic cell 246 of FIG. 6) is more amenable for implementing the programmable NOR gate with a verify mode.

Figure 15:
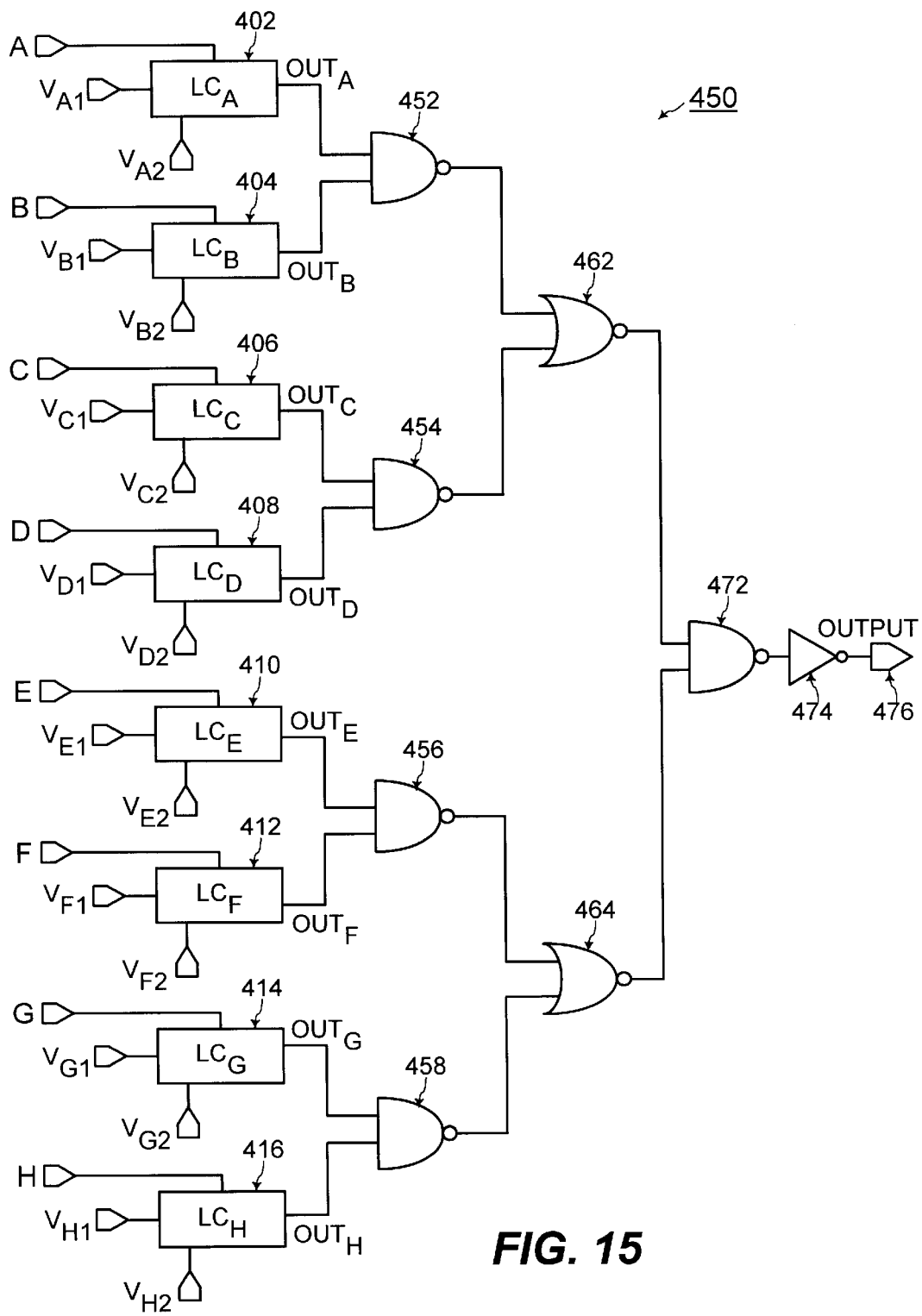
FIG. 15 shows a programmable AND gate comprising a plurality of logic cells with each logic cell having the circuit topology of FIG. 6, according to an embodiment of the present invention.

On the other hand, FIG. 15 illustrates a programmable AND gate 450 implemented with the programmable zero-power logic cells 402, 404, 406, 408, 410, 412, 414, and 416. In contrast to the programmable OR gate 400 of FIG. 13, in the programmable AND gate 450 of FIG. 15, the outputs, $OUT_A$ and $OUT_B$, of the first and second logic cells 402 and 404 are inputs to a first 2-input NAND gate 452. The outputs, $OUT_C$ and $OUT_D$, of the third and fourth logic cells 406 and 408 are inputs to a second 2-input NAND gate 454. The outputs, $OUT_E$ and $OUT_F$, of the fifth and sixth logic cells 410 and 412 are inputs to a third 2-input NAND gate 456. The outputs, $OUT_G$ and $OUT_H$, of the seventh and eighth logic cells 414 and 416 are inputs to a fourth 2-input NAND gate 458.

The outputs of the first and second NAND gates 452 and 454 are inputs to a first 2-input NOR gate 462. The outputs of the third and fourth NAND gates 456 and 458 are inputs to a second 2-input NOR gate 464. The outputs of the first and second NOR gates 462 and 464 are inputs to a fifth 2-input NAND gate 472. The output of the fifth NAND gate 472 is inverted through an inverter 474 to form the OUTPUT signal at the output node 476. The OUTPUT signal at the output node 476 of the programmable AND gate 450 of FIG. 15 is expressed as follows:

$$OUTPUT = OUT_A \cdot OUT_B \cdot OUT_C \cdot OUT_D \cdot OUT_E \cdot OUT_F \cdot OUT_G \cdot OUT_H$$

Thus, the outputs of each of the logic cells 402, 404, 406, 408, 410, 412, 414, and 416 are AND' ed together to form the OUTPUT signal of the programmable AND gate 450.

Referring to FIGS. 2, 6, and 15, for programming the programmable AND gate 450 of FIG. 15, the respective two memory cells 214 and 218 of each of the logic cells 402, 404, 406, 408, 410, 412, 414, and 416 are each programmed or erased to output a logical low state or a logical high state, respectively, for a desired respective output signal at the logic cell.

Figure 16:
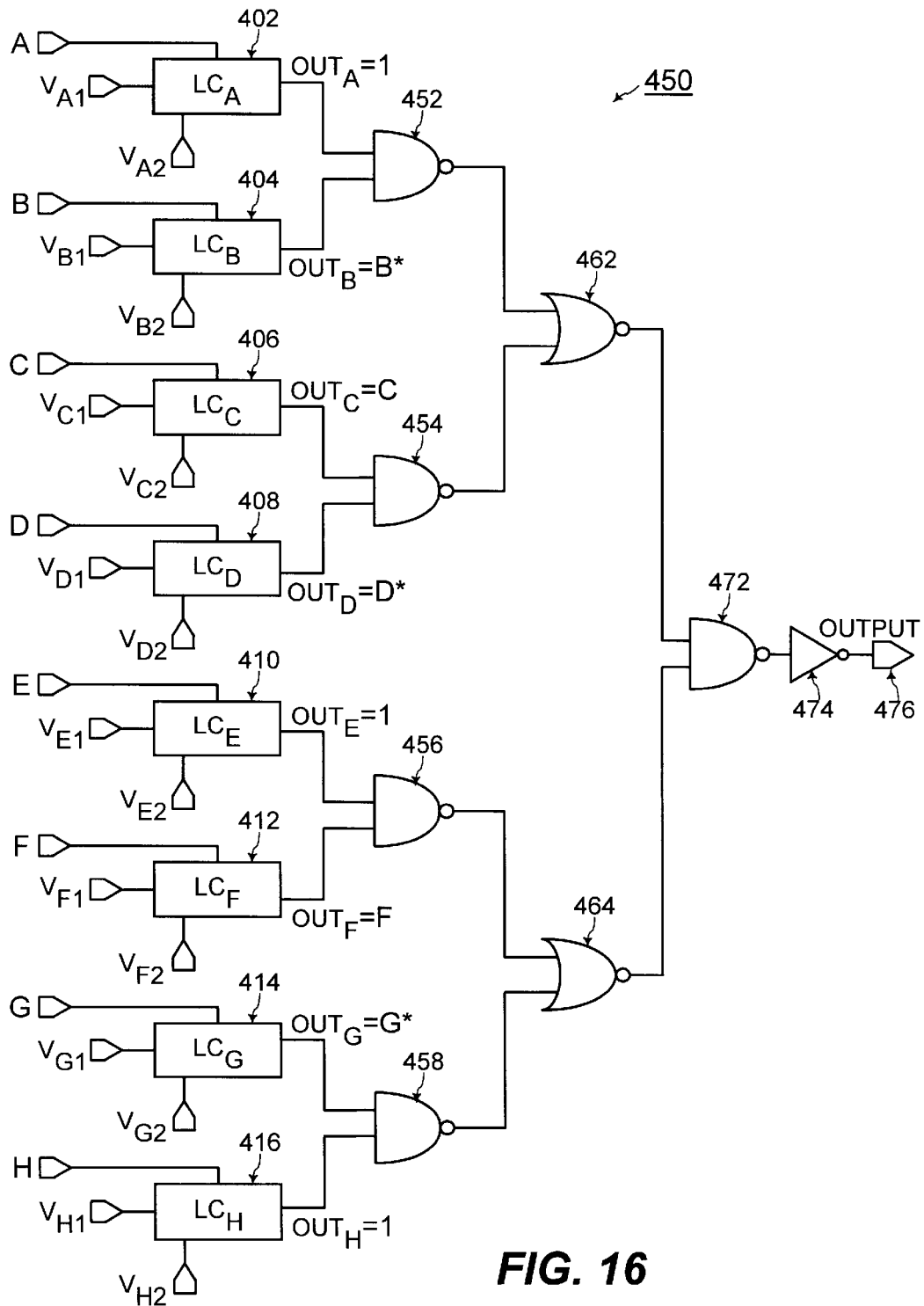
FIG. 16 shows example programmed logic states for the plurality of logic cells of FIG. 15.

For example, referring to FIG. 16, the respective two memory cells of the first logic cell 402 are each erased or programmed such that the output of the first logic cell $OUT_A$="1" (i.e., a logical high state). The respective two memory cells of the second logic cell 404 are each erased or programmed such that the output of the second logic cell $OUT_B$=B* (i.e., the complement of the second input signal B). The respective two memory cells of the third logic cell 406 are each erased or programmed such that the output of the third logic cell $OUT_C$=C (i.e., the third input signal C). The respective two memory cells of the fourth logic cell 408 are each erased or programmed such that the output of the fourth logic cell $OUT_D$=D* (i.e., the complement of the fourth input signal D).

In addition, the respective two memory cells of the fifth logic cell 410 are each erased or programmed such that the output of the fifth logic cell $OUT_E$="1" (i.e., a logical high state). The respective two memory cells of the sixth logic cell 412 are each erased or programmed such that the output of the sixth logic cell $OUT_F$=F (i.e., the sixth input signal F). The respective two memory cells of the seventh logic cell 414 are each erased or programmed such that the output of the seventh logic cell $OUT_G$=G* (i.e., the complement of the seventh input signal G). The respective two memory cells of the eighth logic cell 416 are each erased or programmed such that the output of the eighth logic cell $OUT_H$="1" (i.e., a logical high state).

In this example, the OUTPUT signal of the programmable AND gate 450 of FIG. 16 during the functional mode of the programmable AND gate 450 is expressed as follows:

$$OUTPUT = B^* \cdot C \cdot D^* \cdot F \cdot G^*$$

In this manner, the respective two memory cells of each of the logic cells 402, 404, 406, 408, 410, 412, 414, and 416 may each be erased or programmed to provide an AND functionality of any combination of the eight input signals A, B, C, D, E, F, G, and H and their complements A*, B*, C*, D*, E*, F*, G*, and H*, respectively, with the programmable AND gate 450, as would be apparent to one of ordinary skill in the art of electronics from the description herein.

Note that if the output of the respective logic cell for an input signal is set to be a logical high state, "1", then the input signal does not appear in the expression of the OUTPUT signal for the programmable AND gate 450. If the output of any of the logic cells 402, 404, 406, 408, 410, 412, 414, and 416 is set to a logical low state, then the OUTPUT signal is automatically a logical low state for the programmable AND gate 450.

In a preferred embodiment of the present invention, each of the logic cells 402, 404, 406, 408, 410, 412, 414, and 416 of the programmable AND gate 450 is implemented as the logic cell 246 of FIG. 6 with a respective input signal selection circuit (implemented as the input signal selection circuit 236 of FIG. 4). Referring to the truth table of FIG. 7 for the logic cell 246 of FIG. 6, during the verify mode, each of the respective first and second logic states of each of the logic cells 402, 404, 406, 408, 410, 412, 414, and 416 (i.e., $V_{A1}$, $V_{A2}$, $V_{B1}$, $V_{B2}$, $V_{C1}$, $V_{C2}$, $V_{D1}$, $V_{D2}$, $V_{E1}$, $V_{E2}$, $V_{F1}$, $V_{F2}$, $V_{G1}$, $V_{G2}$, $V_{H1}$, and $V_{H2}$) is initially set to a logical low state "0" such that the respective output (i.e., $OUT_A$, $OUT_B$, $OUT_C$, $OUT_D$, $OUT_E$, $OUT_F$, $OUT_G$, and $OUT_H$) of each of the logic cells is a logical high state "1".

In this manner, the output signal at the output node 476 of the programmable AND gate 450 is initially a logical high state "1" during the verify mode. Then, for verifying the output of each of the two memory cells 214 and 228 of any one of the logic cells 402, 404, 406, 408, 410, 412, 414, and 416, the respective set of the first and second logic states $V_1$ and $V_2$ are altered for that logic cell. Referring to FIGS. 4, 6, and 7, for verifying the first output $M_{OUT1}$ of the first memory cell 214, the first logic state $V_1=I_1$ is set to a logical high state while the second logic state $V_2=I_2$ remains set to the logical low state. Referring to FIG. 7, in that case, the output signal of a logic cell is a logical high state if the first output $M_{OUT1}$ of the first memory cell 214 is a logical low state, and is a logical low state if the first output $M_{OUT1}$ of the first memory cell 214 is a logical high state.

Alternatively, referring to FIGS. 4, 6, and 7, for verifying the second output $M_{OUT2}$ of the second memory cell 228, the second logic state $V_2=I_2$ is set to a logical high state while the first logic state $V_1=I_1$ remains set to the logical low state. Referring to FIG. 7, in that case, the output signal of a logic cell is a logical high state if the second output $M_{OUT2}$ of the second memory cell 228 is a logical low state, and is a logical low state if the second output $M_{OUT2}$ of the second memory cell 228 is a logical high state.

Referring to the programmable AND gate 450 of FIG. 15, for verifying the first and second outputs $M_{OUT1}$ and $M_{OUT2}$ of any one logic cell, the respective first and second logic states $V_1$ and $V_2$ of that logic cell are varied while the respective first and second logic states $V_1$ and $V_2$ of the other logic cells of the programmable AND gate 450 are maintained at the logical low state. For example, assume that the first and second outputs $M_{OUT1}$ and $M_{OUT2}$ of the memory cells within the third logic cell 406 are verified. In that case, the respective first and second logic states $V_1$ and $V_2$ of each of the first, second, fourth, fifth, sixth, seventh, and eighth logic cells, 402, 404, 408, 410, 412, 414, and 416 (i.e., $V_{A1}$, $V_{A2}$, $V_{B1}$, $V_{B2}$, $V_{D1}$, $V_{D2}$, $V_{E1}$, $V_{E2}$, $V_{F1}$, $V_{F2}$, $V_{G1}$, $V_{G2}$, $V_{H1}$, and $V_{H2}$) are each set to a logical low state "0". Thus, the respective output (i.e., $OUT_A$, $OUT_B$, $OUT_D$, $OUT_E$, $OUT_F$, $OUT_G$, and $OUT_H$) of each of the logic cells 402, 404, 408, 410, 412, 414, and 416 is a logical high state "1" and does not affect the output signal at the output node 476 of the programmable AND gate 450.

In addition, for verifying the first output $M_{OUT1}$ of the first memory cell 214 of the third logic cell 406, the first logic state $V_{C1}=I_1$ is set to a logical high state while the second logic state $V_{C2}=I_2$ remains set to the logical low state. Referring to FIGS. 7 and 15, in that case, the output signal $OUT_C$ of the third logic cell 406 (and thus the output signal at the output node 476 of the programmable AND gate 450) is a logical high state if the first output $M_{OUT1}$ of the first memory cell 214 is a logical low state, and is a logical low state if the first output $M_{OUT1}$ of the first memory cell 214 is a logical high state.

Alternatively, for verifying the second output $M_{OUT2}$ of the second memory cell 228 of the third logic cell 406, the second logic state $V_{C2}=I_2$ is set to a logical high state while the first logic state $V_{C1}=I_1$ remains set to the logical low state. Referring to FIGS. 7 and 15, in that case, the output signal $OUT_C$ of the third logic cell 406 (and thus the output signal at the output node 476 of the programmable AND gate 450) is a logical high state if the second output $M_{OUT2}$ of the second memory cell 228 is a logical low state, and is a logical low state if the second output $M_{OUT2}$ of the second memory cell 228 is a logical high state.

In this manner, the respective logical state of each of the output signals $M_{OUT1}$ and $M_{OUT2}$ of the memory cells within the third logic cell 406 is determined during the verify mode of the programmable AND gate 450. In like manner, the output signals $M_{OUT1}$ and $M_{OUT2}$ of each respective first and second memory cells within each of the other logic cells 402, 404, 408, 410, 412, 414, and 416 may be individually determined during the verify mode of the programmable AND gate 450, as would be apparent to one of ordinary skill in the art of electronics from the description herein.

Referring to FIG. 15, when verifying the output signals $M_{OUT1}$ and $M_{OUT2}$ of the memory cells within the third logic cell 406, the respective output signals (i.e., $OUT_A$, $OUT_B$, $OUT_D$, $OUT_E$, $OUT_F$, $OUT_G$, and $OUT_H$) of each of the other logic cells 402, 404, 408, 410, 412, 414, and 416 is a logical high state "1" to not affect the output signal at the output node 476 of the programmable AND gate 450. Referring to the truth table of FIG. 5 for the logic cell 200 of FIG. 2 and to the truth table of FIG. 7 for the logic cell 246 of FIG. 6, the rows of the second block 253 of the truth table of FIG. 7 has the logical high state "1" as the output irrespective of the logical states of the outputs $M_{OUT1}$ and $M_{OUT2}$ of the memory cells. Therefore, the logic cell 246 of FIG. 6 (rather than the logic cell 200 of FIG. 2) is more amenable for implementing the programmable AND gate 450 with a verify mode.

Similarly, the programmable AND gate 450 of FIG. 15 is a programmable NAND gate with removal of the inverter 474 such that the logic cells 402, 404, 406, 408, 410, 412, 414, and 416 readily form a programmable NAND gate. As would be apparent to one of ordinary skill in the art of electronics from the description herein, the logic cell 246 of FIG. 6 (rather than the logic cell 200 of FIG. 2) is more amenable for implementing the programmable NAND gate with a verify mode.

In this manner, the verification of the outputs $M_{OUT1}$ and $M_{OUT2}$ of the memory cells for each of the logic cells 402, 404, 406, 408, 410, 412, 414, and 416 is advantageously performed through the logic cells 402, 404, 406, 408, 410, 412, 414, and 416 such that a separate verification unit is not needed. A separate verification unit may disadvantageously require additional chip space. Rather, with use of the logic cells 402, 404, 406, 408, 410, 412, 414, and 416 that are implemented as the logic cell 200 of FIG. 2 for programmable OR or NOR gates and that are implemented as the logic cell 246 of FIG. 6 for programmable AND or NAND gates, verification of the outputs $M_{OUT1}$ and $M_{OUT2}$ of the memory cells for each of the logic cells may be performed with just the programmable gates, without any separate additional verification unit, to save chip space.

In addition, programmable logic devices such as the programmable OR gate 400 of FIG. 13 and the programmable AND gate 450 of FIG. 15 are implemented with the zero-power logic cell 200 of FIG. 2 or the zero-power logic cell 246 of FIG. 6, and the zero-power memory cell 250 of FIG. 3. The logic cells 200 or 246 and the electrically erasable and programmable memory cell 250 of the present invention are implemented in CMOS technology without use of a current source. Rather, the logic cells 200 or 246 and the electrically erasable and programmable memory cell 250 of the present invention operate to provide logic levels with zero static power dissipation. Additionally, the logic cells 200 or 246 and the electrically erasable and programmable memory cell 250 of the present invention implemented in CMOS technology are further scalable. Furthermore, the NOR gates and the NAND gates of the programmable OR and AND gates 400 and 450 of FIGS. 13 and 15 may be implemented in CMOS (complementary metal oxide semiconductor) technology with zero power dissipation also such that the programmable OR and AND gates 400 and 450 dissipate zero power.

The foregoing is by way of example only and is not intended to be limiting. For example, any number of corresponding input signals and logic cells may be used for the programmable OR and AND gate s 400 and 450. In addition, other types of programmable logic devices may be implemented using the logic cells 200 or 246 and the electrically erasable and programmable memory cell 250 of the present invention. Furthermore, the zero-power memory cell 250 of FIG. 8 may be used for any types of applications having an electrically erasable and/or programmable memory cell, aside from just the example of the logic cell 200 and 246 used in programmable logic devices.

Furthermore, any specified voltage levels described herein are by way of example only, and other voltage levels may be used for practicing the present invention, as would be apparent to one of ordinary skill in the art of electronics from the description herein. For example, in the table of FIG. 9, negative voltages may be used instead of the ground voltage of 0 Volts, or the voltage level for $V_{pp-}$, $V_{pp}$, or $V_{dd}$ may be different from that used in the table of FIG. 9. Additionally, the logic cells 200 or 246 and the memory cell 250 may be implemented using other types of P-channel and N-channel field effect transistors aside from just PMOSFETs and NMOSFETs, as would be apparent to one of ordinary skill in the art of electronics from the description herein. The present invention is limited only as defined in the following claims and equivalents thereof.

We claim:

1. An electrically erasable and programmable zero-power memory cell comprising:

a first variable voltage generator;

a second variable voltage generator;

a P-channel sense transistor having a source coupled to said first variable voltage generator;

an N-channel sense transistor having a source coupled to said second variable voltage generator;

wherein a drain of said P-channel sense transistor is coupled to a drain of said N-channel sense transistor to form an output of the memory cell;

and wherein a gate of said P-channel sense transistor is coupled to a gate of said N-channel sense transistor to form a floating gate of the memory cell;

a write transistor having a source coupled to a WBL (write bit line) and having a gate coupled to a WL (write line);

a tunneling capacitor coupled between said floating gate of the memory cell and a drain of said write transistor; and a coupling capacitor coupled between a CG (control gate) node and said floating gate of the memory cell;

wherein said CG (control gate) node is biased with a positive voltage during an erase operation and wherein said WBL (write bit line) and said WL (write line) are biased to turn on said write transistor such that a negative voltage forms on said floating gate of the memory cell by charge tunneling through said tunneling capacitor to turn on said P-channel sense transistor for forming a logical high state at said output of said memory cell during said erase operation;

and wherein said CG (control gate) node is biased with a ground or negative voltage during a program operation and wherein said WBL (write bit line) and said WL (write line) are biased to turn on said write transistor such that a positive voltage forms on said floating gate of the memory cell by charge tunneling through said tunneling capacitor to turn on said N-channel sense transistor for forming a logical low state at said output of said memory cell during said program operation;

and wherein each of said first and second variable voltage generators applies a positive voltage at said respective source of each of said P-channel and N-channel sense transistors during said erase operation.

2. The electrically erasable and programmable zero-power memory cell of claim 1, wherein each of said first and second variable voltage generators applies a ground or negative voltage at said respective source of each of said P-channel and N-channel sense transistors during said program operation.

3. The electrically erasable and programmable zero-power memory cell of claim 1, wherein said P-channel sense transistor is comprised of a PMOSFET (P-channel metal oxide semiconductor field effect transistor), and wherein said N-channel sense transistor and said write transistor are comprised of NMOSFETs (N-channel metal oxide semiconductor field effect transistors).

4. The electrically erasable and programmable zero-power memory cell of claim 1, wherein a magnitude of the respective threshold voltage of each of said P-channel and N-channel sense transistors is higher than a magnitude of a threshold voltage of standard process P-channel and N-channel transistors.

5. The electrically erasable and programmable zero-power memory cell of claim 4, wherein a sum of a magnitude of a respective threshold voltage of said P-channel sense transistor and a magnitude of a respective threshold voltage of said N-channel sense transistor is greater than a minimum value in a range of a difference of a first voltage generated by said first voltage generator and a second voltage generated by said second voltage generator during a read operation of said memory cell.

6. The electrically erasable and programmable zero-power memory cell of claim 4, wherein said magnitude of the respective threshold voltage of each of said P-channel and N-channel sense transistors is adjusted with a thickness of a respective gate oxide and with a concentration of respective channel doping for each of said P-channel and N-channel sense transistors.

7. The electrically erasable and programmable zero-power memory cell of claim 6, wherein the thickness of the respective gate oxide for each of said P-channel and N-channel sense transistors is for a high voltage MOSFET, and wherein the concentration of the respective channel doping for each of said P-channel and N-channel sense transistors is for a low voltage MOSFET.

8. The electrically erasable and programmable zero-power memory cell of claim 1, wherein said first variable voltage generator applies a positive voltage on said source of said P-channel sense transistor and applies a ground or negative voltage on said source of said N-channel sense transistor, during a read operation.

9. An electrically erasable and programmable zero-power memory cell comprising:

a first variable voltage generator;

a second variable voltage generator;

a P-channel sense transistor having a source coupled to said first variable voltage generator;

an N-channel sense transistor having a source coupled to said second variable voltage generator;

wherein a drain of said P-channel sense transistor is coupled to a drain of said N-channel sense transistor to form an output of the memory cell;

and wherein a gate of said P-channel sense transistor is coupled to a gate of said N-channel sense transistor to form a floating gate of the memory cell;

a write transistor having a source coupled to a WBL (write bit line) and having a gate coupled to a WL (write line);

a tunneling capacitor coupled between said floating gate of the memory cell and a drain of said write transistor; and a coupling capacitor coupled between a CG (control gate) node and said floating gate of the memory cell;

wherein said CG (control gate) node is biased with a positive voltage during an erase operation and wherein said WBL (write bit line) and said WL (write line) are biased to turn on said write transistor such that a negative voltage forms on said floating gate of the memory cell by charge tunneling through said tunneling capacitor to turn on said P-channel sense transistor for forming a logical high state at said output of said memory cell during said erase operation;

and wherein said CG (control gate) node is biased with a ground or negative voltage during a program operation and wherein said WBL (write bit line) and said WL (write line) are biased to turn on said write transistor such that a positive voltage forms on said floating gate of the memory cell by charge tunneling through said tunneling capacitor to turn on said N-channel sense transistor for forming a logical low state at said output of said memory cell during said program operation;

and wherein each of said first and second variable voltage generators applies a ground or negative voltage at said respective source of each of said P-channel and N-channel sense transistors during said program operation.

10. An electrically erasable and programmable zero-power memory cell comprising:

a P-channel sense transistor having a source coupled to a first voltage generator;

an N-channel sense transistor having a source coupled to a second voltage generator;

wherein a drain of said P-channel sense transistor is coupled to a drain of said N-channel sense transistor to form an output of the memory cell;

and wherein a gate of said P-channel sense transistor is coupled to a gate of said N-channel sense transistor to form a floating gate of the memory cell;

a write transistor having a source coupled to a WBL (write bit line) and having a gate coupled to a WL (write line);

a tunneling capacitor coupled between said floating gate of the memory cell and a drain of said write transistor; and a coupling capacitor coupled between a CG (control gate) node and said floating gate of the memory cell;

wherein said CG (control gate) node is biased with a positive voltage during an erase operation and wherein said WBL (write bit line) and said WL (write line) are biased to turn on said write transistor such that a negative voltage forms on said floating gate of the memory cell by charge tunneling through said tunneling capacitor to turn on said P-channel sense transistor for forming a logical high state at said output of said memory cell during said erase operation;

and wherein said CG (control gate) node is biased with a ground or negative voltage during a program operation and wherein said WBL (write bit line) and said WL (write line) are biased to turn on said write transistor such that a positive voltage forms on said floating gate of the memory cell by charge tunneling through said tunneling capacitor to turn on said N-channel sense transistor for forming a logical low state at said output of said memory cell during said program operation;

and wherein a magnitude of the respective threshold voltage of each of said P-channel and N-channel sense transistors is higher than a magnitude of a threshold voltage of standard process P-channel and N-channel transistors.

11. The electrically erasable and programmable zero-power memory cell of claim 10, wherein a sum of a magnitude of a respective threshold voltage of said P-channel sense transistor and a magnitude of a respective threshold voltage of said N-channel sense transistor is greater than a minimum value in a range of a difference of a first voltage generated by said first voltage generator and a second voltage generated by said second voltage generator during a read operation of the memory cell.

12. The electrically erasable and programmable zero-power memory cell of claim 10, wherein the thickness of the respective gate oxide for each of said P-channel and N-channel sense transistors is for a high voltage MOSFET, and wherein the concentration of the respective channel doping for each of said P-channel and N-channel sense transistors is for a low voltage MOSFET.

13. An electrically erasable and programmable zero-power memory cell comprising:

a first variable voltage generator;

a second variable voltage generator;

a P-channel sense transistor having a source coupled to said first variable voltage generator;

an N-channel sense transistor having a source coupled to said second variable voltage generator;

wherein a drain of said P-channel sense transistor is coupled to a drain of said N-channel sense transistor to form an output of the memory cell;

and wherein a gate of said P-channel sense transistor is coupled to a gate of said N-channel sense transistor to form a floating gate of the memory cell;

means for forming a negative voltage on said floating gate of the memory cell to turn on said P-channel sense transistor for forming a logical high state at said output of said memory cell during an erase operation;

means for forming a positive voltage on said floating gate of the memory cell to turn on said N-channel sense transistor for forming a logical low state at said output of said memory cell during a program operation;

wherein each of said first and second variable voltage generators applies a positive voltage at said respective source of each of said P-channel and N-channel sense transistors during said erase operation.

14. The electrically erasable and programmable zero-power memory cell of claim 13, wherein each of said first and second variable voltage generators applies a ground or negative voltage at said respective source of each of said P-channel and N-channel sense transistors during said program operation.

15. An electrically erasable and programmable zero-power memory cell comprising:

a first variable voltage generator;

a second variable voltage generator;

a P-channel sense transistor having a source coupled to said first variable voltage generator;

an N-channel sense transistor having a source coupled to said second variable voltage generator;

wherein a drain of said P-channel sense transistor is coupled to a drain of said N-channel sense transistor to form an output of the memory cell;

and wherein a gate of said P-channel sense transistor is coupled to a gate of said N-channel sense transistor to form a floating gate of the memory cell;

means for forming a negative voltage on said floating gate of the memory cell to turn on said P-channel sense transistor for forming a logical high state at said output of said memory cell during an erase operation;

means for forming a positive voltage on said floating gate of the memory cell to turn on said N-channel sense transistor for forming a logical low state at said output of said memory cell during a program operation;

wherein a magnitude of the respective threshold voltage of each of said P-channel and N-channel sense transistors is higher than a magnitude of a threshold voltage of standard process P-channel and N-channel transistors.

16. The electrically erasable and programmable zero-power memory cell of claim 15, wherein a sum of a magnitude of a respective threshold voltage of said P-channel sense transistor and a magnitude of a respective threshold voltage of said N-channel sense transistor is greater than a minimum value in a range of a difference of a first voltage generated by said first voltage generator and a second voltage generated by said second voltage generator during a read operation of the memory cell.

17. The electrically erasable and programmable zero-power memory cell of claim 15, wherein the thickness of the respective gate oxide for each of said P-channel and N-channel sense transistors is for a high voltage MOSFET, and wherein the concentration of the respective channel doping for each of said P-channel and N-channel sense transistors is for a low voltage MOSFET.

18. A method for erasing and programming an electrically erasable and programmable zero-power memory cell, the method comprising:

applying a first voltage generated by a first variable voltage generator on a source of a P-channel sense transistor;

applying a second voltage generated by a second variable voltage generator on a source of an N-channel sense transistor;

wherein a drain of said P-channel sense transistor is coupled to a drain of said N-channel sense transistor to form an output of the memory cell;

and wherein a gate of said P-channel sense transistor is coupled to a gate of said N-channel sense transistor to form a floating gate of the memory cell;

and wherein a write transistor has a source coupled to a WBL (write bit line), and has a gate coupled to a WL (write line), and has a drain coupled to said floating gate of the memory cell via a tunneling capacitor;

and wherein a coupling capacitor is coupled between a CG (control gate) node and said floating gate of the memory cell;

biasing said CG (control gate) node with a positive voltage during an erase operation and biasing said WBL (write bit line) and said WL (write line) to turn on said write transistor such that a negative voltage forms on said floating gate of the memory cell by charge tunneling through said tunneling capacitor to turn on said P-channel sense transistor for forming a logical high state at said output of said memory cell during said erase operation;

biasing said CG (control gate) node with a ground or negative voltage during a program operation and biasing said WBL (write bit line) and said WL (write line) to turn on said write transistor such that a positive voltage forms on said floating gate of the memory cell by charge tunneling through said tunneling capacitor to turn on said N-channel sense transistor for forming a logical low state at said output of said memory cell during said program operation; and applying a positive voltage at said respective source of each of said P-channel and N-channel sense transistors with said first and second variable voltage generators, during said erase operation.

19. The method of claim 18, further comprising:

applying a ground or negative voltage at said respective source of each of said P-channel and N-channel sense transistors with said first and second variable voltage generators, during said program operation.

20. The method of claim 18, wherein said P-channel sense transistor is comprised of a PMOSFET (P-channel metal oxide semiconductor field effect transistor), and wherein said N-channel sense transistor and said write transistor are comprised of NMOSFETs (N-channel metal oxide semiconductor field effect transistors).

21. The method of claim 18, wherein a magnitude of the respective threshold voltage of each of said P-channel and N-channel sense transistors is higher than a magnitude of a threshold voltage of standard process P-channel and N-channel transistors.

22. The method of claim 21, wherein a sum of a magnitude of a respective threshold voltage of said P-channel sense transistor and a magnitude of a respective threshold voltage of said N-channel sense transistor is greater than a minimum value in a range of a difference of a first voltage generated by said first variable voltage generator and a second voltage generated by said second variable voltage generator during a read operation of said memory cell.

23. The method of claim 22, wherein said magnitude of the respective threshold voltage of each of said P-channel and N-channel sense transistors is adjusted with a thickness of a respective gate oxide and with a concentration of respective channel doping for each of said P-channel and N-channel sense transistors.

24. The method of claim 23, wherein the thickness of the respective gate oxide for each of said P-channel and N-channel sense transistors is for a high voltage MOSFET, and wherein the concentration of the respective channel doping for each of said P-channel and N-channel sense transistors is for a low voltage MOSFET.

25. The method of claim 18, further comprising:

applying a positive voltage on said source of said P-channel sense transistor with said first variable voltage generator and applying a ground or negative voltage on said source of said N-channel sense transistor with said second variable voltage generator, during a read operation.

26. A method for erasing and programming an electrically erasable and programmable zero-power memory cell, the method comprising:

applying a first voltage generated by a first variable voltage generator on a source of a P-channel sense transistor;

applying a second voltage generated by a second variable voltage generator on a source of an N-channel sense transistor;

wherein a drain of said P-channel sense transistor is coupled to a drain of said N-channel sense transistor to form an output of the memory cell;

and wherein a gate of said P-channel sense transistor is coupled to a gate of said N-channel sense transistor to form a floating gate of the memory cell;

and wherein a write transistor has a source coupled to a WBL (write bit line), and has a gate coupled to a WL (write line), and has a drain coupled to said floating gate of the memory cell via a tunneling capacitor;

and wherein a coupling capacitor is coupled between a CG (control gate) node and said floating gate of the memory cell;

biasing said CG (control gate) node with a positive voltage during an erase operation and biasing said WBL (write bit line) and said WL (write line) to turn on said write transistor such that a negative voltage forms on said floating gate of the memory cell by charge tunneling through said tunneling capacitor to turn on said P-channel sense transistor for forming a logical high state at said output of said memory cell during said erase operation;

biasing said CG (control gate) node with a ground or negative voltage during a program operation and biasing said WBL (write bit line) and said WL (write line) to turn on said write transistor such that a positive voltage forms on said floating gate of the memory cell by charge tunneling through said tunneling capacitor to turn on said N-channel sense transistor for forming a logical low state at said output of said memory cell during said program operation; and applying a ground or negative voltage at said respective source of each of said P-channel and N-channel sense transistors with said first and second variable voltage generators, during said program operation.

27. A method for erasing and programming an electrically erasable and programmable zero-power memory cell, the method comprising:

applying a first voltage on a source of a P-channel sense transistor;

applying a second voltage on a source of an N-channel sense transistor;

wherein a drain of said P-channel sense transistor is coupled to a drain of said N-channel sense transistor to form an output of the memory cell;

and wherein a gate of said P-channel sense transistor is coupled to a gate of said N-channel sense transistor to form a floating gate of the memory cell;

and wherein a write transistor has a source coupled to a WBL (write bit line), and has a gate coupled to a WL (write line), and has a drain coupled to said floating gate of the memory cell via a tunneling capacitor;

and wherein a coupling capacitor is coupled between a CG (control gate) node and said floating gate of the memory cell;

biasing said CG (control gate) node with a positive voltage during an erase operation and biasing said WBL (write bit line) and said WL (write line) to turn on said write transistor such that a negative voltage forms on said floating gate of the memory cell by charge tunneling through said tunneling capacitor to turn on said P-channel sense transistor for forming a logical high state at said output of said memory cell during said erase operation; and biasing said CG (control gate) node with a ground or negative voltage during a program operation and biasing said WBL (write bit line) and said WL (write line) to turn on said write transistor such that a positive voltage forms on said floating gate of the memory cell by charge tunneling through said tunneling capacitor to turn on said N-channel sense transistor for forming a logical low state at said output of said memory cell during said program operation;

wherein a magnitude of the respective threshold voltage of each of said P-channel and N-channel sense transistors is higher than a magnitude of a threshold voltage of standard process P-channel and N-channel transistors.

28. The method of claim 27, wherein a sum of a magnitude of a respective threshold voltage of said P-channel sense transistor and a magnitude of a respective threshold voltage of said N-channel sense transistor is greater than a minimum value in a range of a difference of a first voltage generated by said first voltage generator and a second voltage generated by said second voltage generator during a read operation of the memory cell.

29. The method of claim 27, wherein the thickness of the respective gate oxide for each of said P-channel and N-channel sense transistors is for a high voltage MOSFET, and wherein the concentration of the respective channel doping for each of said P-channel and N-channel sense transistors is for a low voltage MOSFET.

30. A method for fabricating an electrically erasable and programmable zero-power memory cell, the method comprising:

forming a P-channel sense transistor having a source coupled to a first voltage generator;

forming an N-channel sense transistor having a source coupled to a second voltage generator;

wherein a drain of said P-channel sense transistor is coupled to a drain of said N-channel sense transistor to form an output of the memory cell;

and wherein a gate of said P-channel sense transistor is coupled to a gate of said N-channel sense transistor to form a floating gate of the memory cell;

performing a first channel doping implantation for implanting a P-type channel dopant into an N-channel region of said N-channel sense transistor, wherein said a first concentration of said P-type channel dopant implanted into said N-channel region of said N-channel sense transistor is for a low voltage NMOSFET;

performing a second channel doping implantation for implanting an N-type channel dopant into a P-channel region of said P-channel sense transistor, wherein said a second concentration of said N-type channel dopant implanted into said P-channel region of said P-channel sense transistor is for a low voltage PMOSFET;

forming an N-channel gate oxide over said N-channel region of said N-channel sense transistor;

wherein a first thickness of said N-channel gate oxide has a thickness of a gate oxide for a high voltage NMOSFET; and forming a P-channel gate oxide over said P-channel region of said P-channel sense transistor;

wherein a second thickness of said P-channel gate oxide has a thickness of a gate oxide for a high voltage PMOSFET.

31. The method of claim 30, further comprising:

forming a write transistor having a source coupled to a WBL (write bit line) and having a gate coupled to a WL (write line);

forming a tunneling capacitor coupled between said floating gate of the memory cell and a drain of said write transistor; and forming a coupling capacitor coupled between a CG (control gate) node and said floating gate of the memory cell;

wherein said CG (control gate) node is biased with a positive voltage during an erase operation and wherein said WBL (write bit line) and said WL (write line) are biased to turn on said write transistor such that a negative voltage forms on said floating gate of the memory cell by charge tunneling through said tunneling capacitor to turn on said P-channel sense transistor for forming a logical high state at said output of said memory cell during said erase operation;

and wherein said CG (control gate) node is biased with a ground or negative voltage during a program operation and wherein said WBL (write bit line) and said WL (write line) are biased to turn on said write transistor such that a positive voltage forms on said floating gate of the memory cell by charge tunneling through said tunneling capacitor to turn on said N-channel sense transistor for forming a logical low state at said output of said memory cell during said program operation.

* * * * *